United States Patent [19]
Hasegawa et al.

[11] Patent Number: 5,717,625
[45] Date of Patent: Feb. 10, 1998

[54] SEMICONDUCTOR MEMORY DEVICE

[75] Inventors: Takehiro Hasegawa; Yukihito Oowaki; Shigeyoshi Watanabe, all of Yokohama; Ken-ichi Maeda, Kamakura; Mitsuo Saito, Yokosuka; Masako Yoshida; Ryo Fukuda, both of Yokohama; Shinichiro Shiratake, Tokyo, all of Japan

[73] Assignee: Kabushiki Kaisha Toshiba, Kawasaki, Japan

[21] Appl. No.: 784,963

[22] Filed: Jan. 16, 1997

Related U.S. Application Data

[63] Continuation of Ser. No. 364,235, Dec. 27, 1994, abandoned.

[30] Foreign Application Priority Data

| Dec. 27, 1993 | [JP] | Japan | 5-348441 |
| Dec. 28, 1993 | [JP] | Japan | 5-349141 |
| Apr. 19, 1994 | [JP] | Japan | 6-080424 |
| Sep. 17, 1994 | [JP] | Japan | 6-248443 |

[51] Int. Cl.$^6$ ............................................. G11C 15/00
[52] U.S. Cl. ................. 365/49; 365/189.05; 365/189.07
[58] Field of Search ................ 365/49, 189.05, 365/189.07

[56] References Cited

U.S. PATENT DOCUMENTS 5,220,526  6/1993  Giles et al. ........................ 365/49
5,267,190  11/1993 Easley et al. ...................... 365/49
5,321,651  6/1994  Monk ................................ 365/49

FOREIGN PATENT DOCUMENTS 4-147490  5/1992  Japan.
4-258878  9/1992  Japan.

OTHER PUBLICATIONS

IEEE ISSCC Digest of Technical Papers, vol. 34, pp. 106–107, TAM 6.2, 1994, K. Kimura et al., "A Block Oriented RAM, Architecture".

IEEE ISSCC Digest of Technical Papers, vol. 36, pp. 46–47, WP 3.3, 1994; T. Hasegawa et al., "An Exp. DRAM with an and structured cell".

Primary Examiner—Joseph E. Clawson, Jr.
Attorney, Agent, or Firm—Oblon, Spivak, McClelland, Maier & Neustadt, P.C.

[57] ABSTRACT

In a semiconductor memory device wherein a plurality of memory cell units formed by connecting a plurality of memory cells in series are provided and each of the memory cell units is connected to a bit line, the semiconductor memory device comprises control circuit for directly reading data of a register cell during a reading operation when the previous row address designates the same memory cell as the present row address, and a data changing controlling circuit for changing data of an arbitrary memory cell of the memory cell unit to data of the memory cell closest to the bit line contact in the memory cell unit, and a row decoder for corresponding row addresses which select the memory of memory cell units, to the upper addresses than the parts of the row addresses which select a memory unit among the memory cell units.

5 Claims, 42 Drawing Sheets

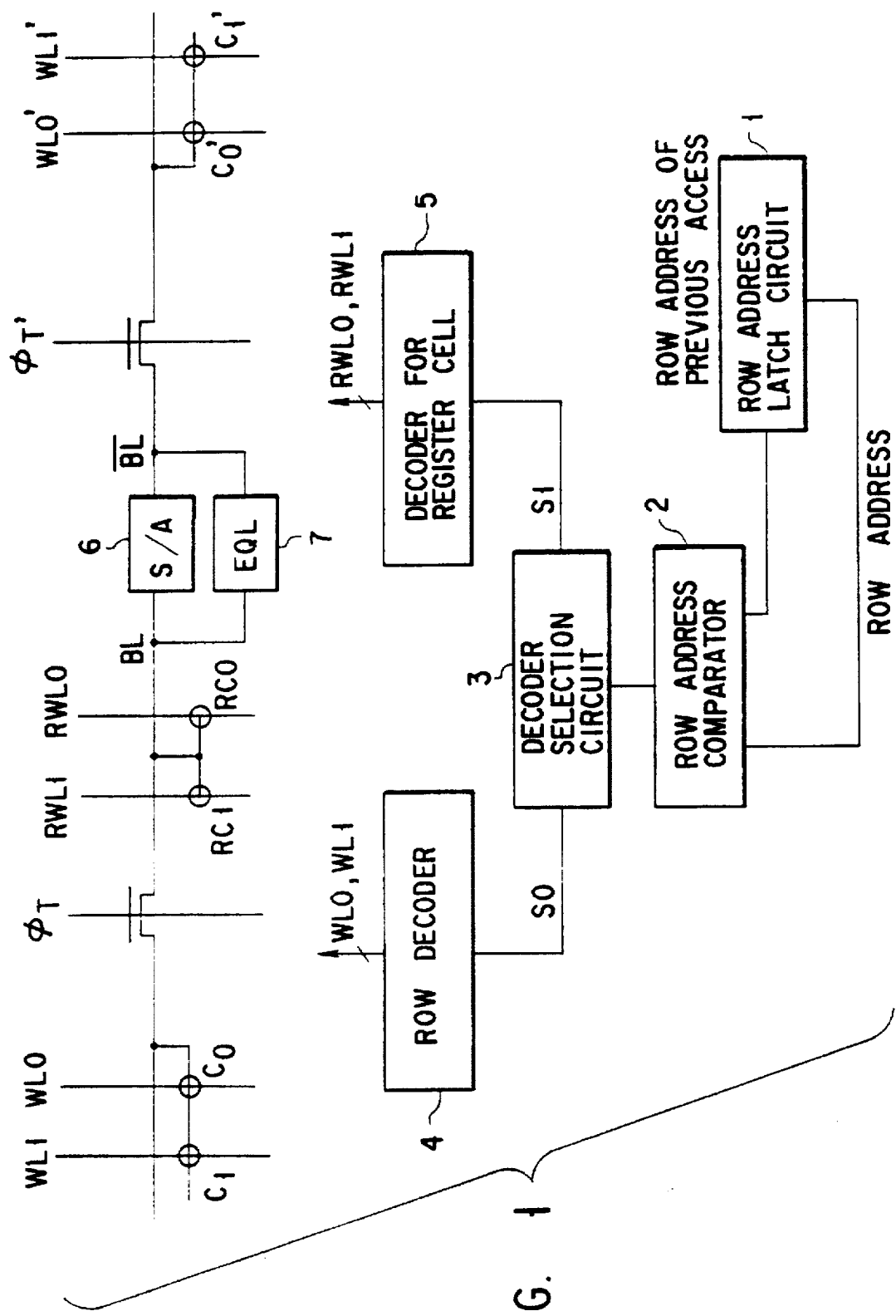
F I G. 1

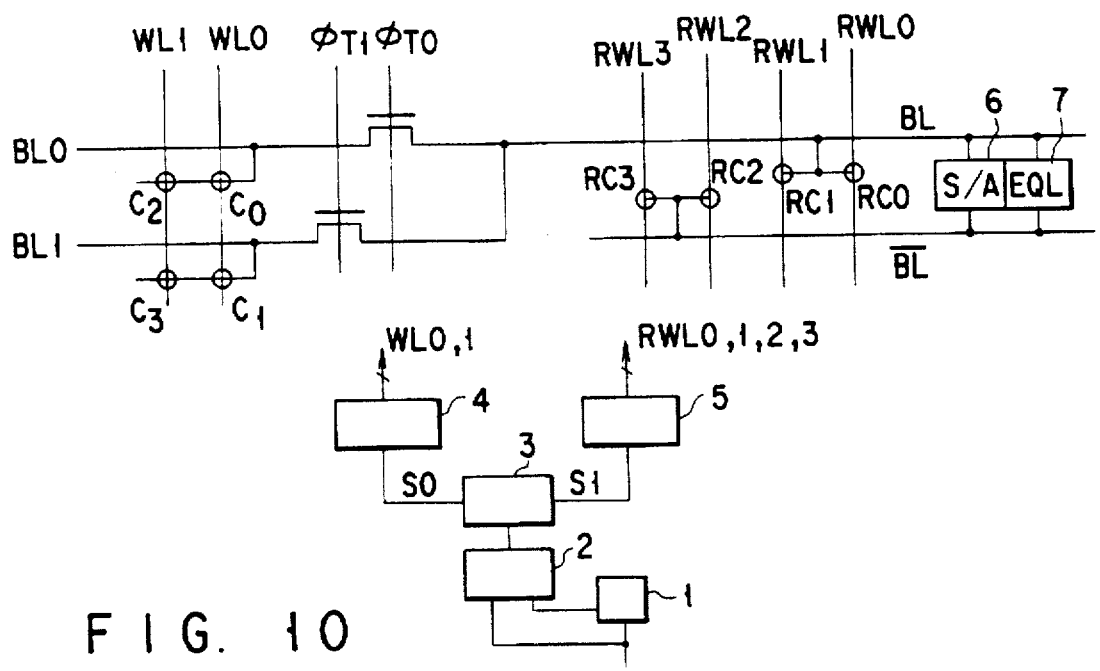
F I G. 10
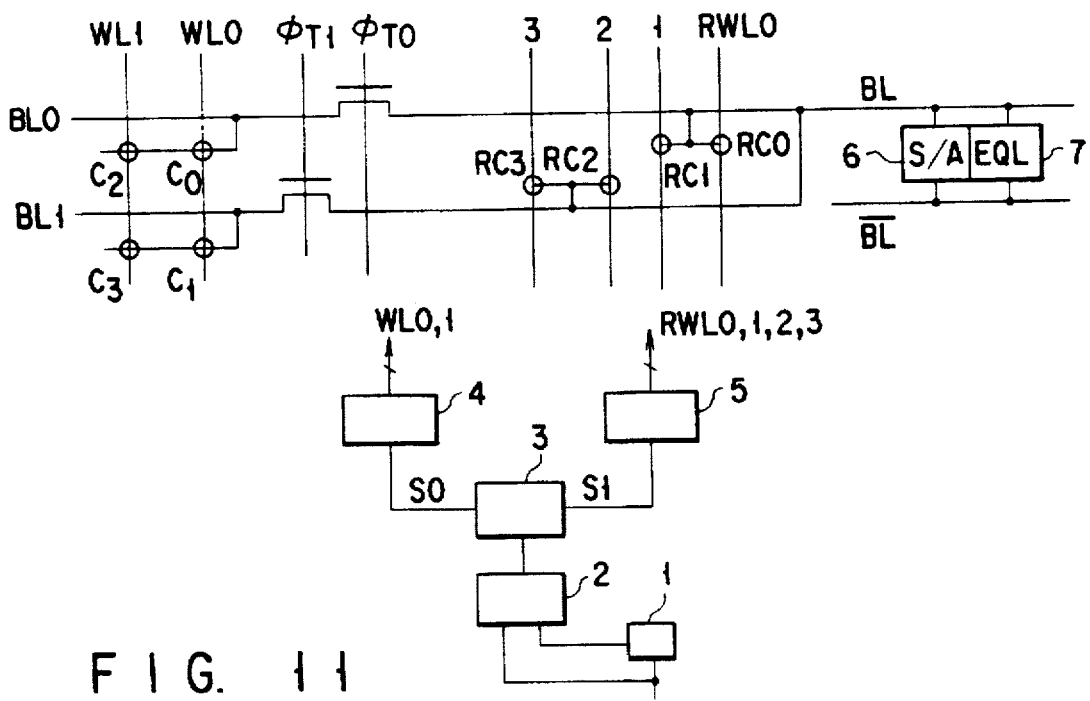
F I G. 11

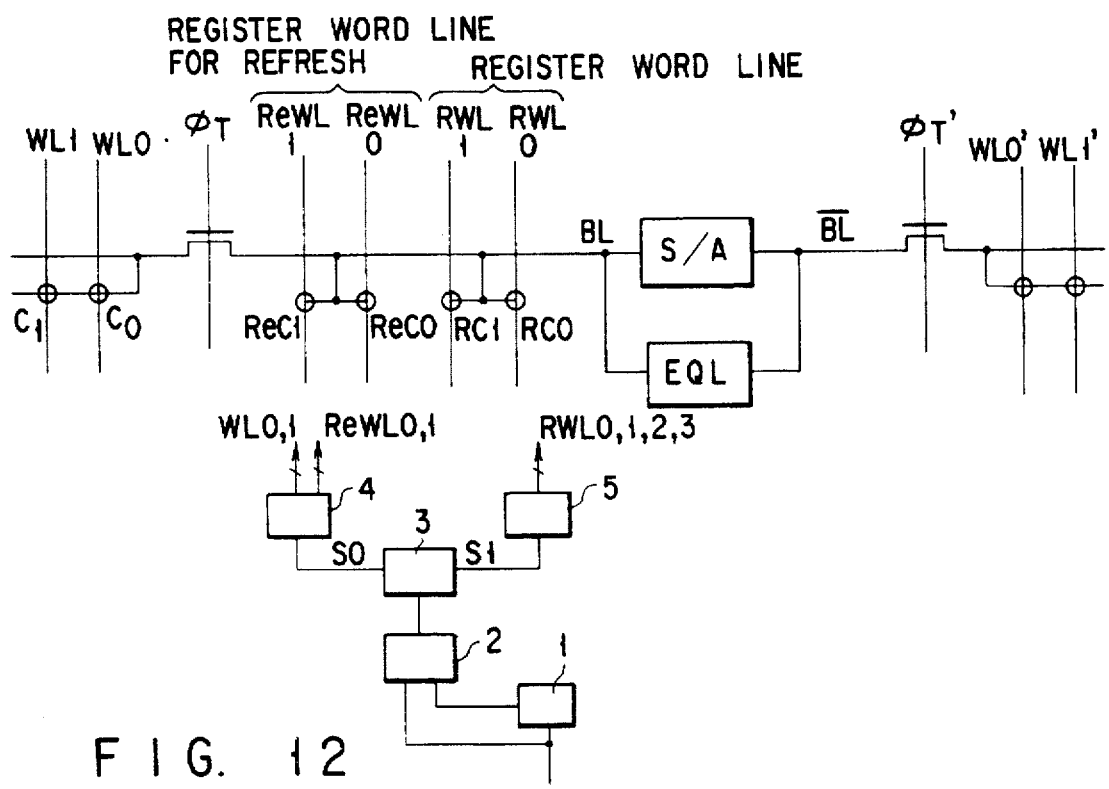
F I G. 12
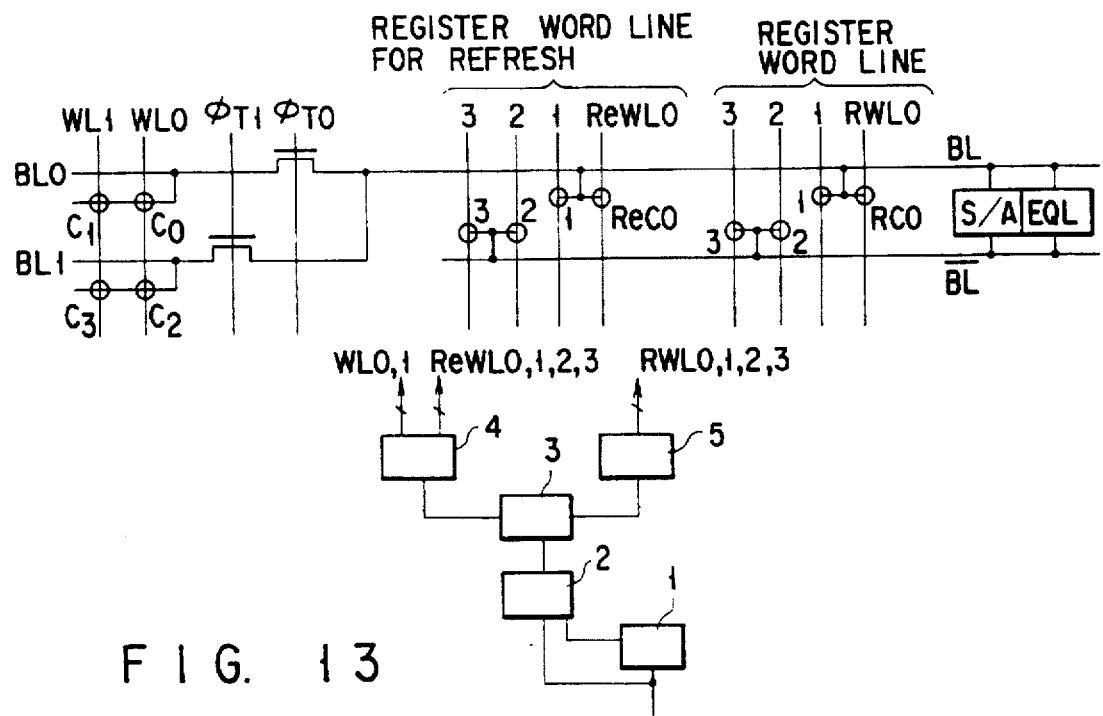
F I G. 13

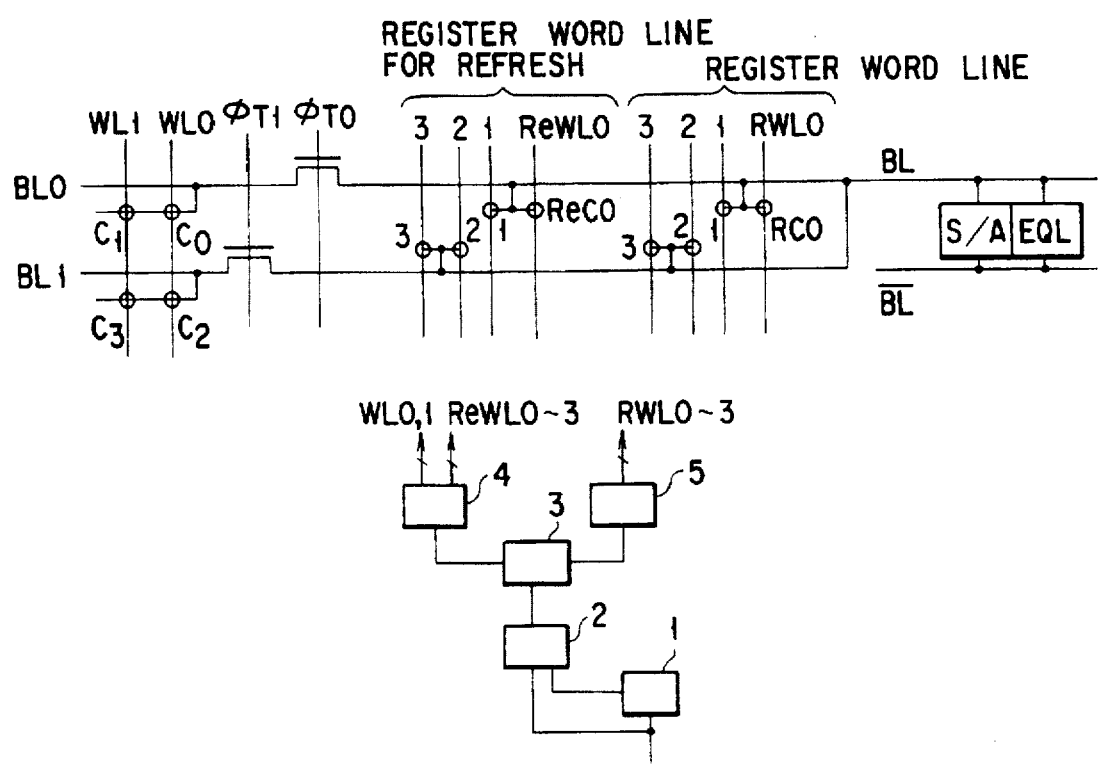
F I G. 14

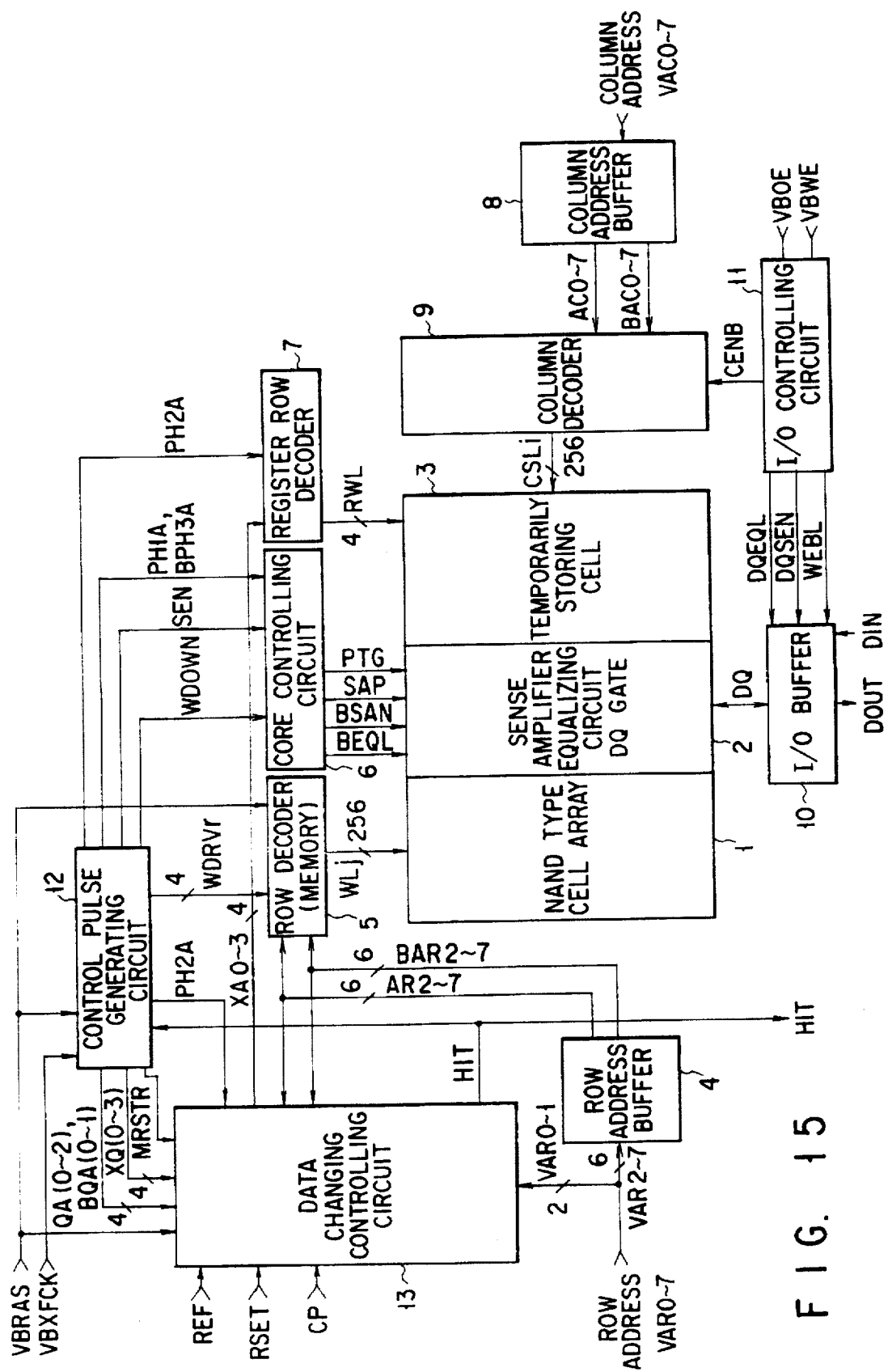
F I G. 15

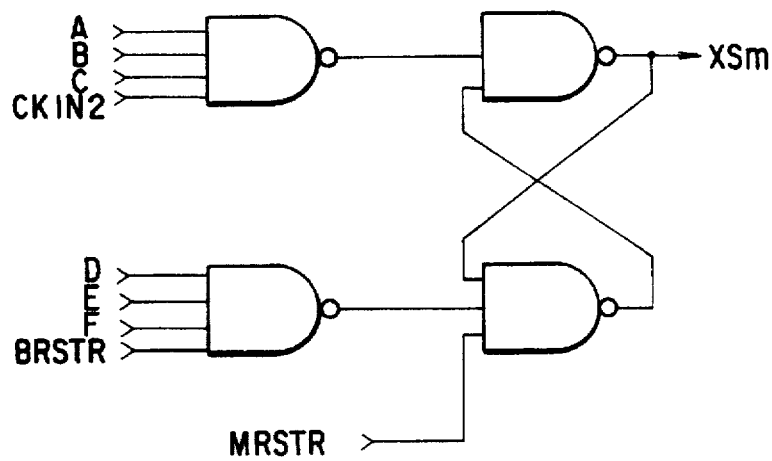
FIG. 19A
| m | A | B | C | D | E | F |
|---|---|---|---|---|---|---|
| 0 | BQC<0> | BQC<1> | BQC<2> | BQC<0> | BQC<1> | BQC<2> |
| 1 | QC<0> | BQC<1> | BQC<2> | QC<0> | QC<1> | QC<2> |
| 2 | BQC<0> | QC<1> | BQC<2> | BQC<0> | QC<1> | QC<2> |
| 3 | QC<0> | QC<1> | BQC<2> | QC<0> | BQC<1> | QC<2> |
FIG. 19B
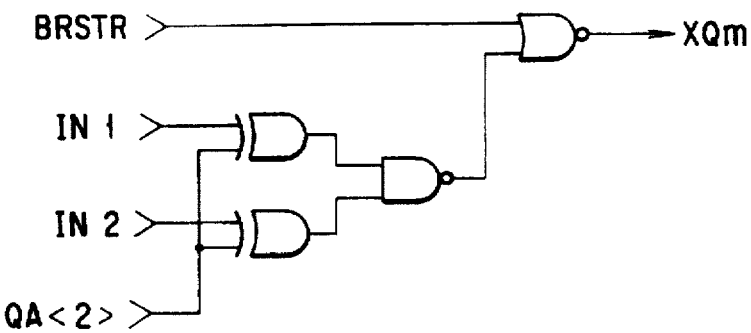
FIG. 20A
| m | 0 | 1 | 2 | 3 |
|---|---|---|---|---|
| IN1 | BQA<0> | QA<0> | BQA<0> | QA<0> |
| IN2 | BQA<1> | BQA<1> | QA<1> | QA<1> |
FIG. 20B

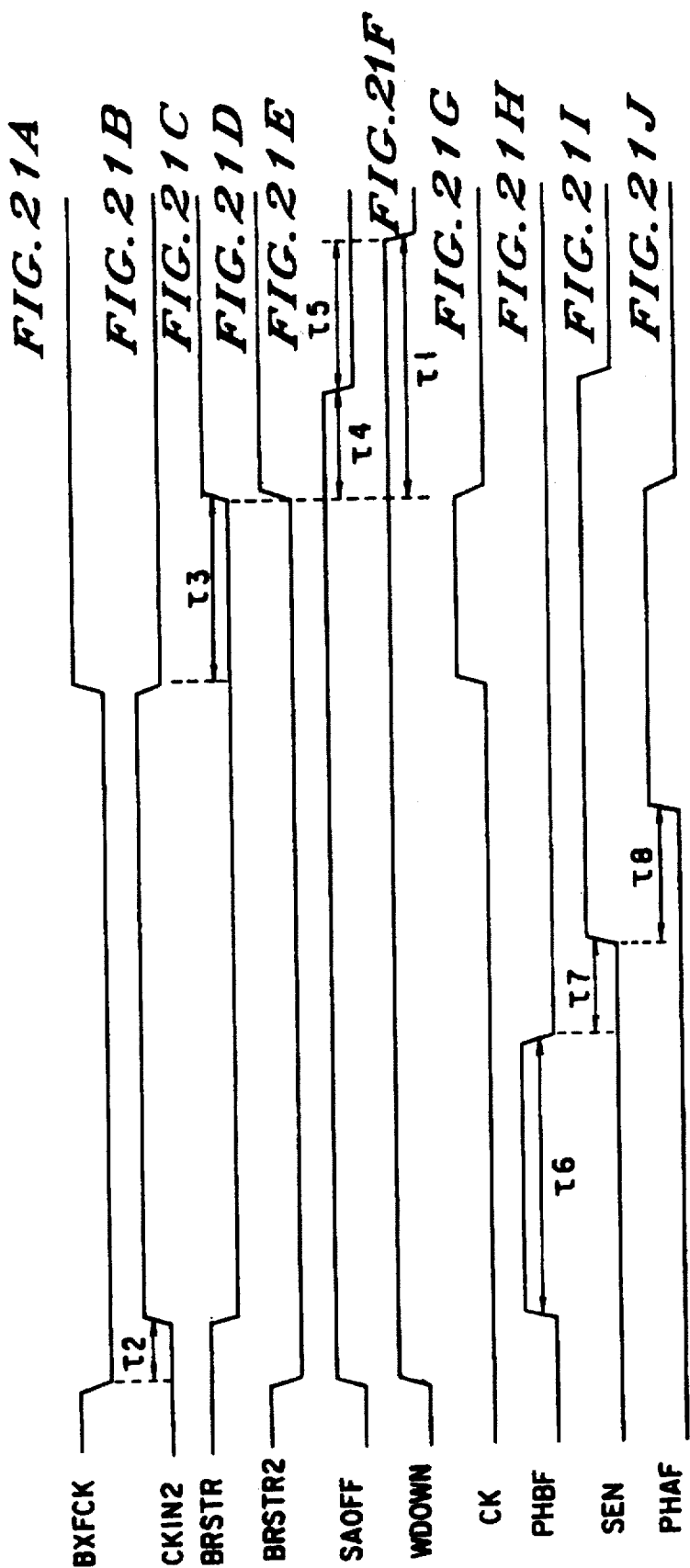

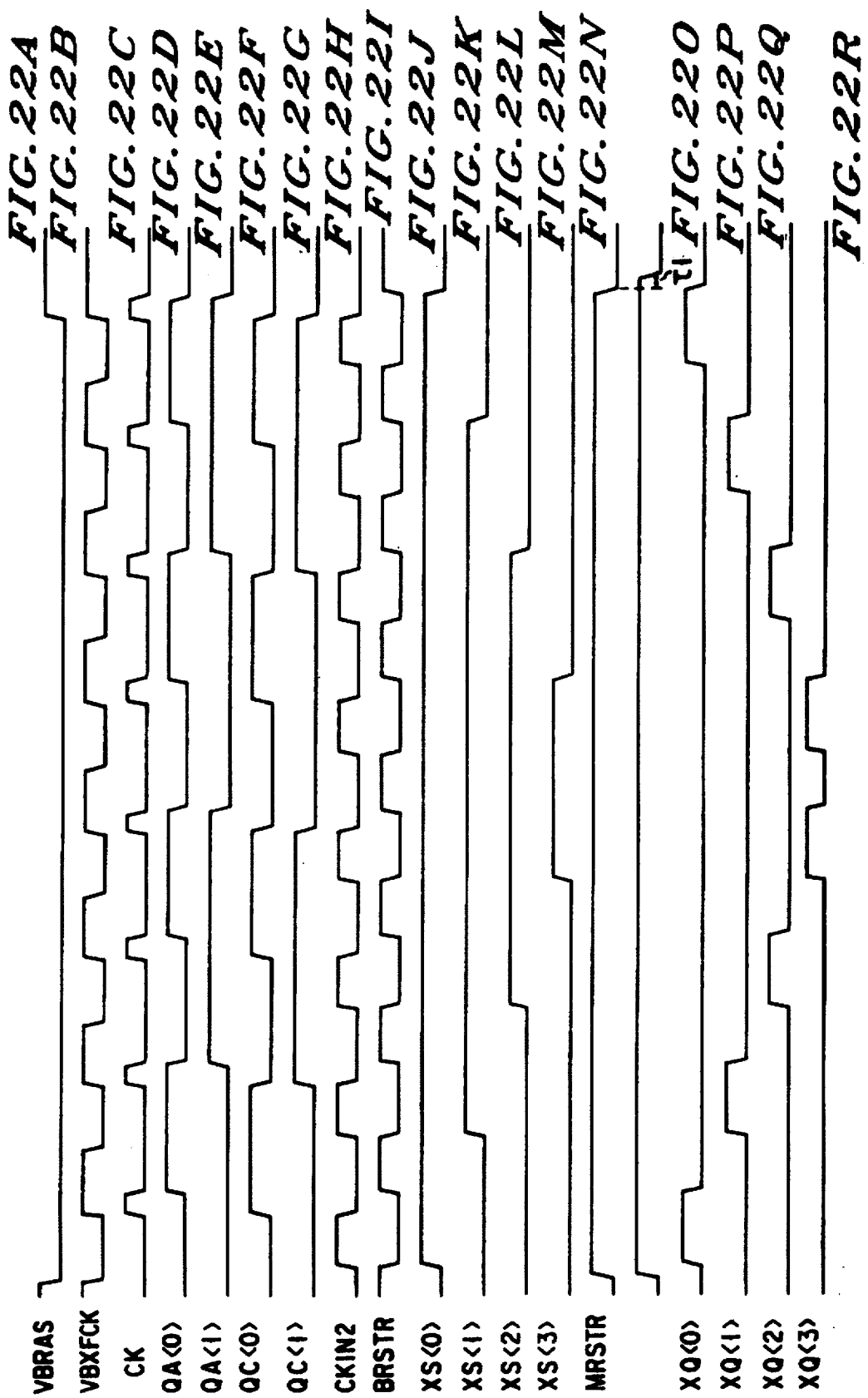

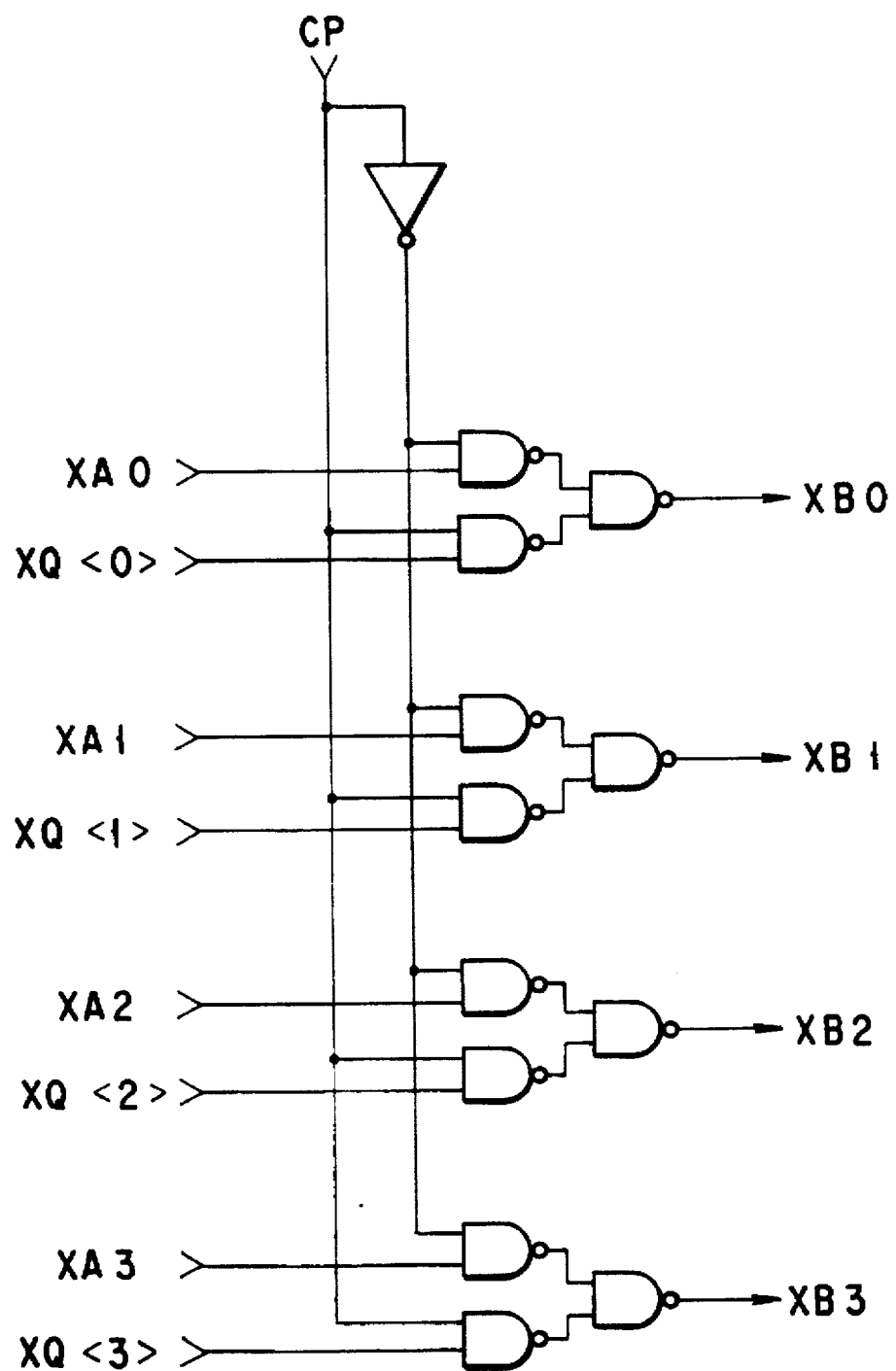
F I G. 28

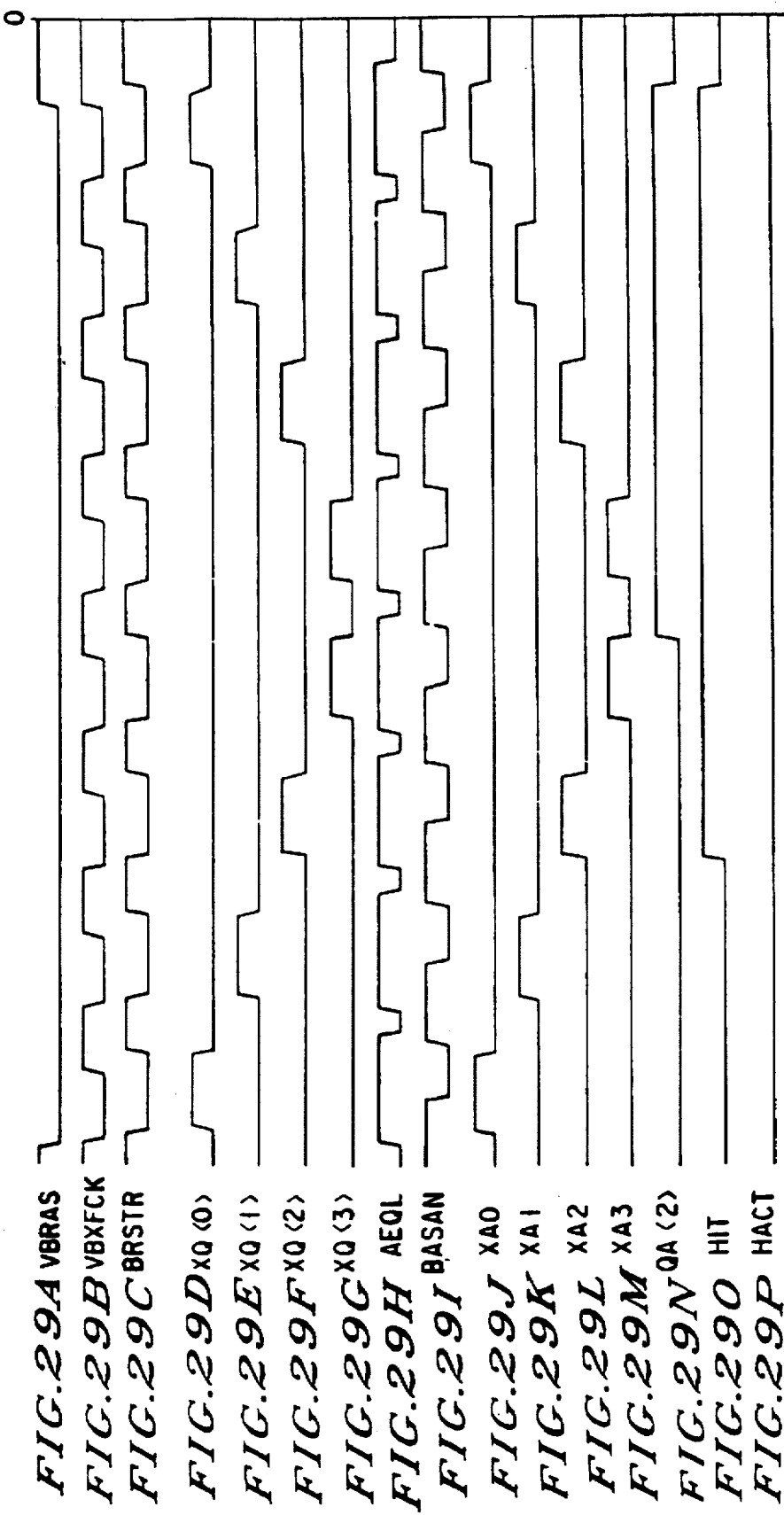

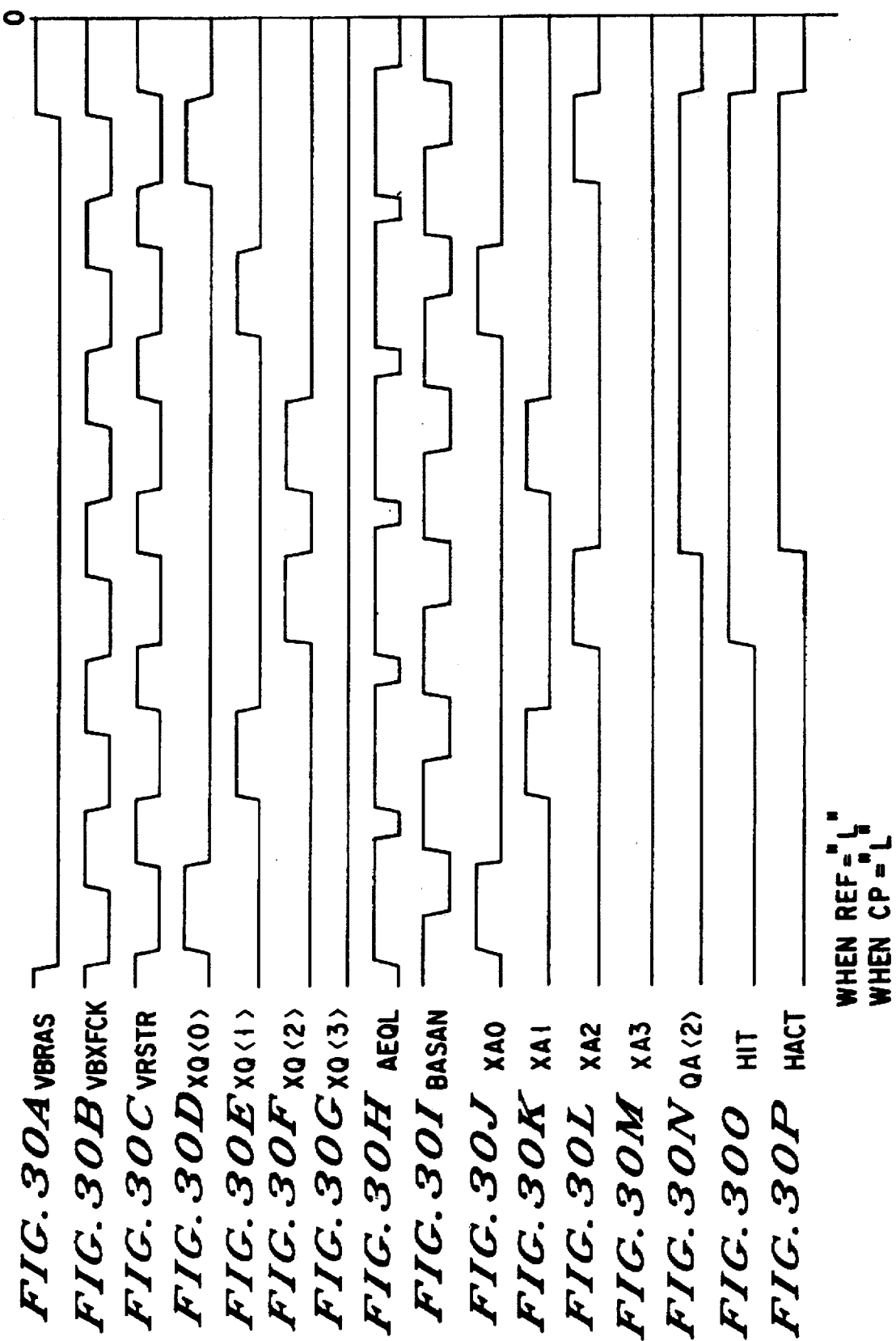

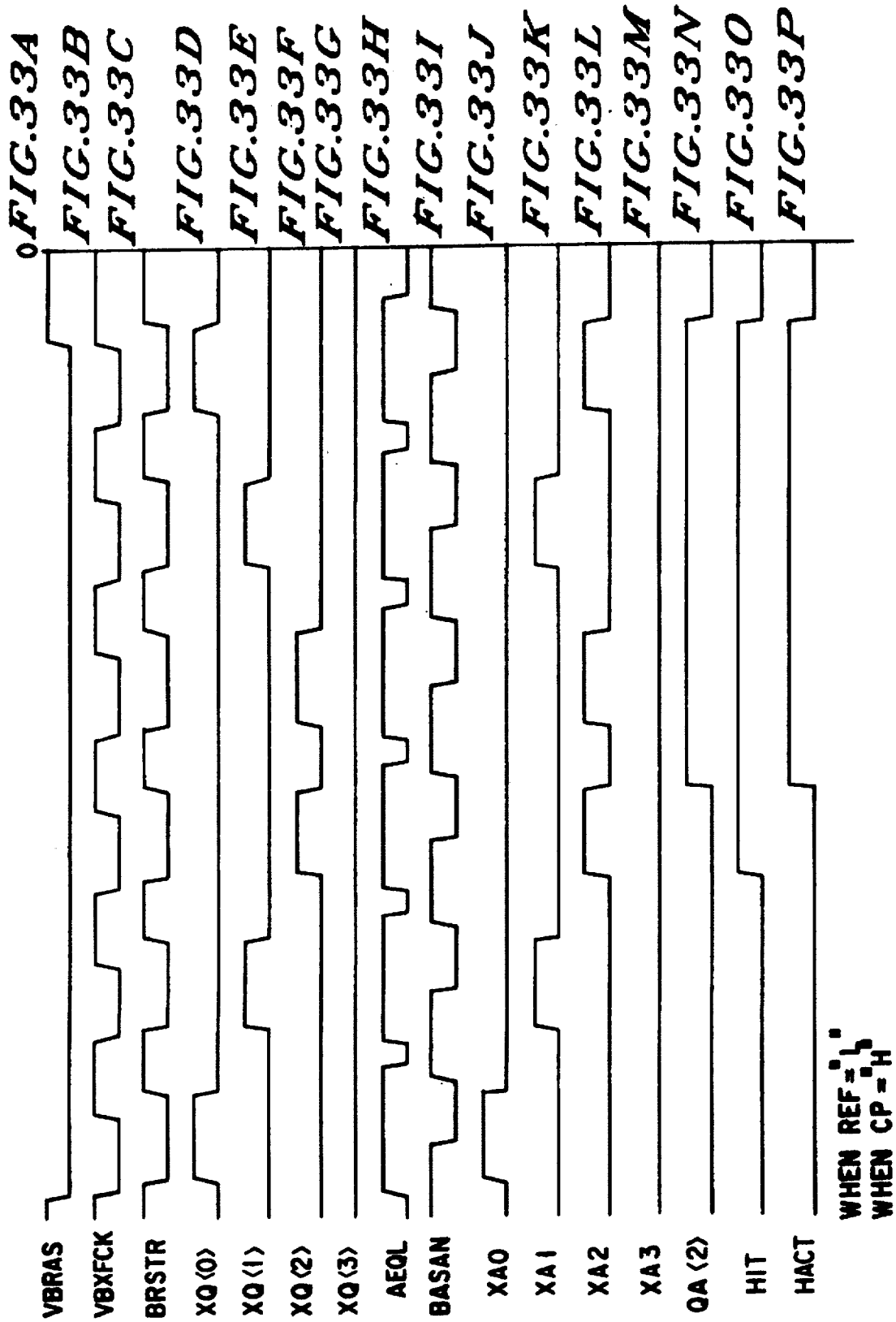

COPY OPERATION
START WRITING

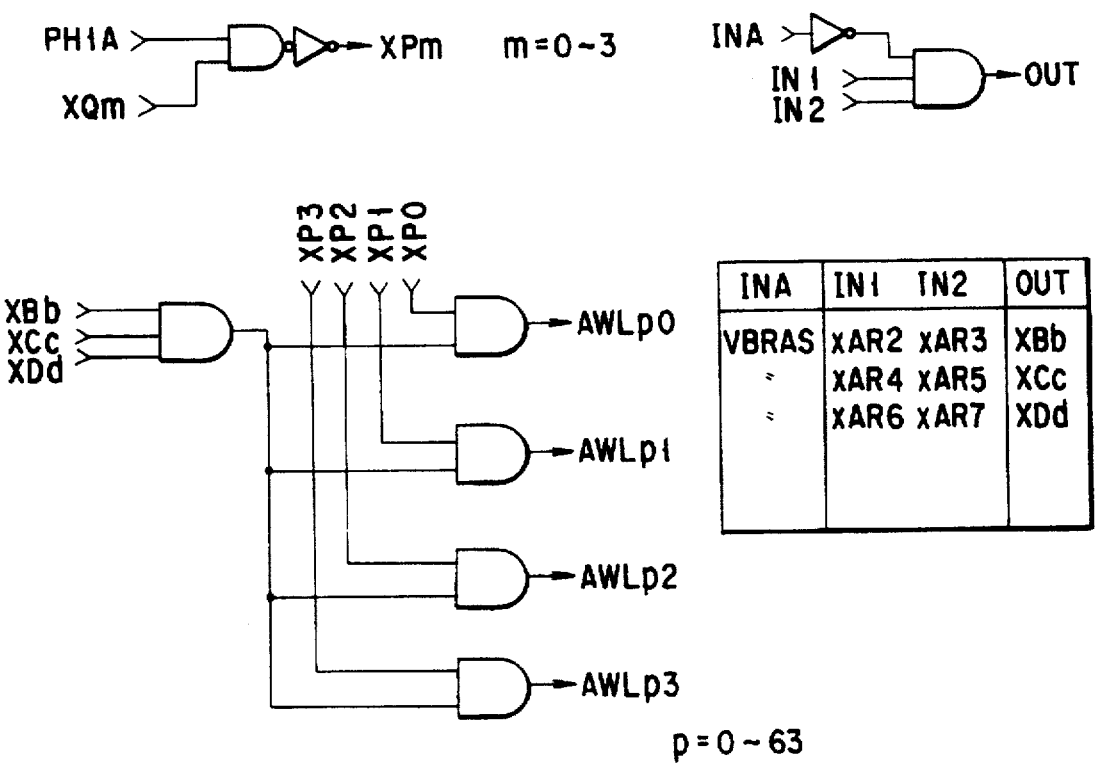
F I G. 36

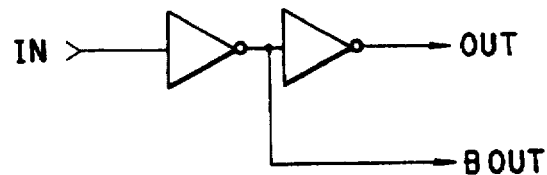
FIG. 39A
| IN | OUT | B OUT |
|---|---|---|
| VAR 2 | AR 2 | BAR 2 |
| 3 | 3 | 3 |
| 4 | 4 | 4 |
| 5 | 5 | 5 |
| 6 | 6 | 6 |
| 7 | 7 | 7 |
FIG. 39B
| IN | OUT | B OUT |
|---|---|---|
| VAC 0 | AC 0 | BAC 0 |
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
FIG. 39C
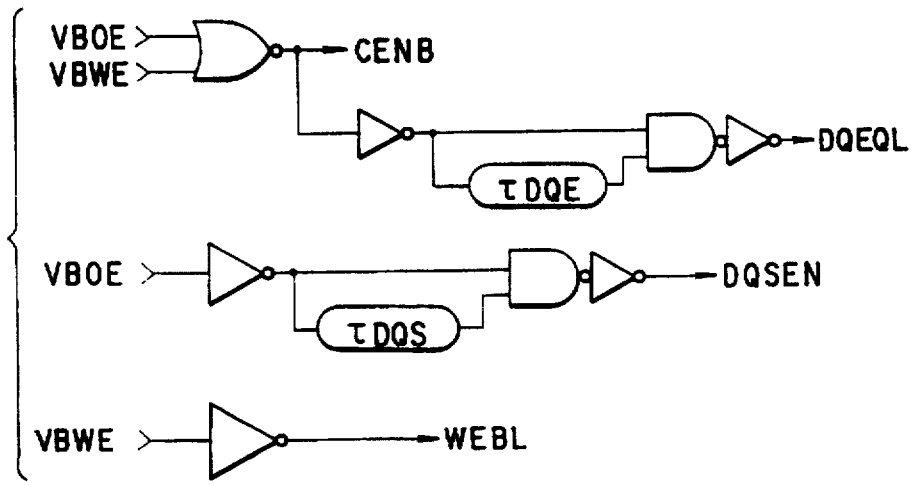
FIG. 41A
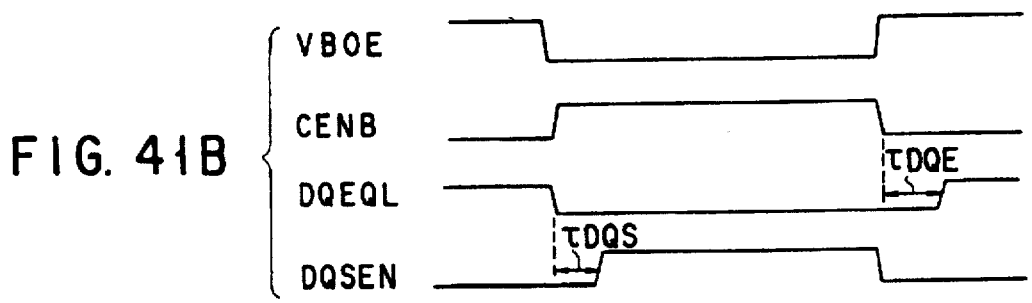
FIG. 41B

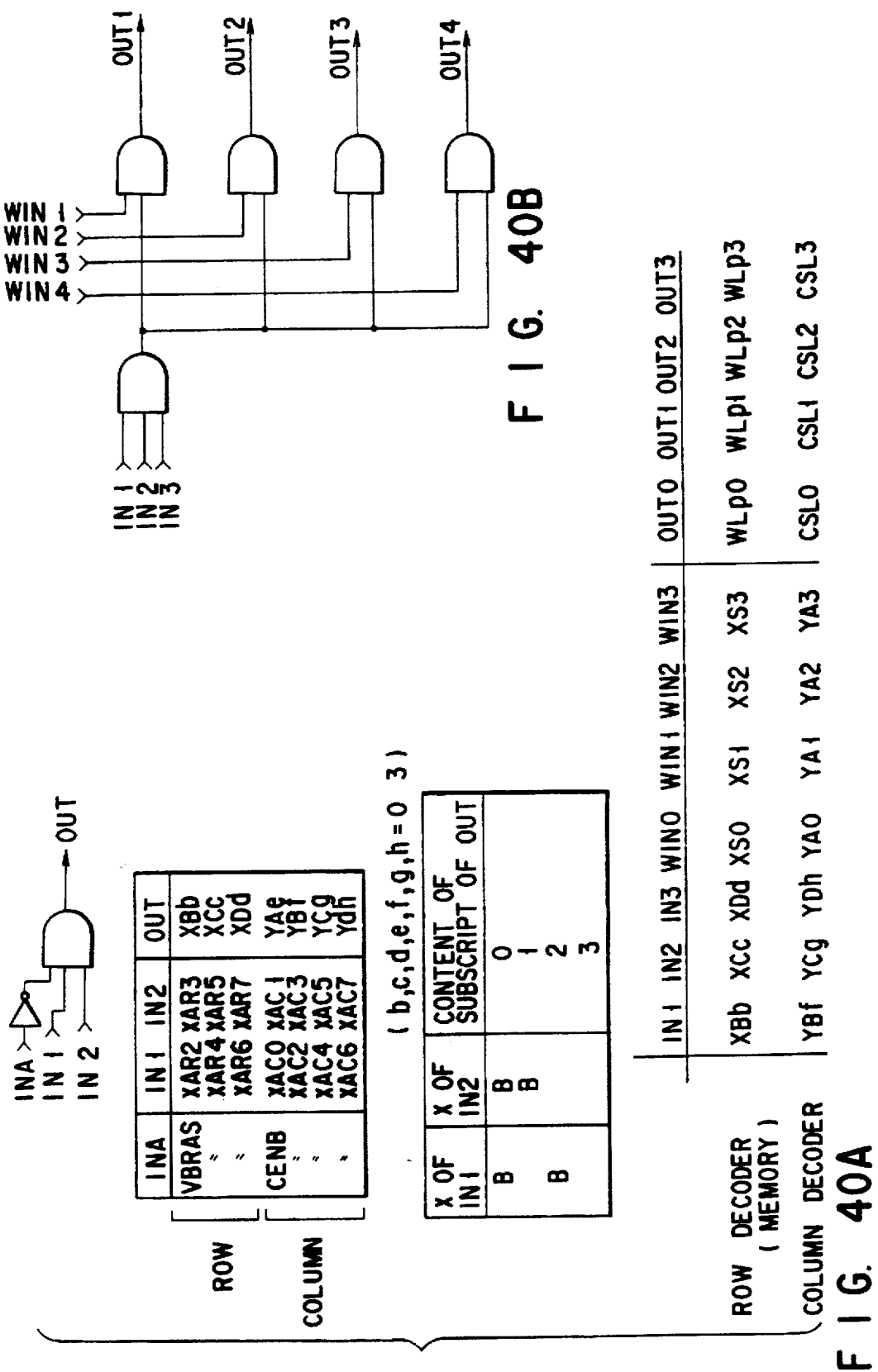

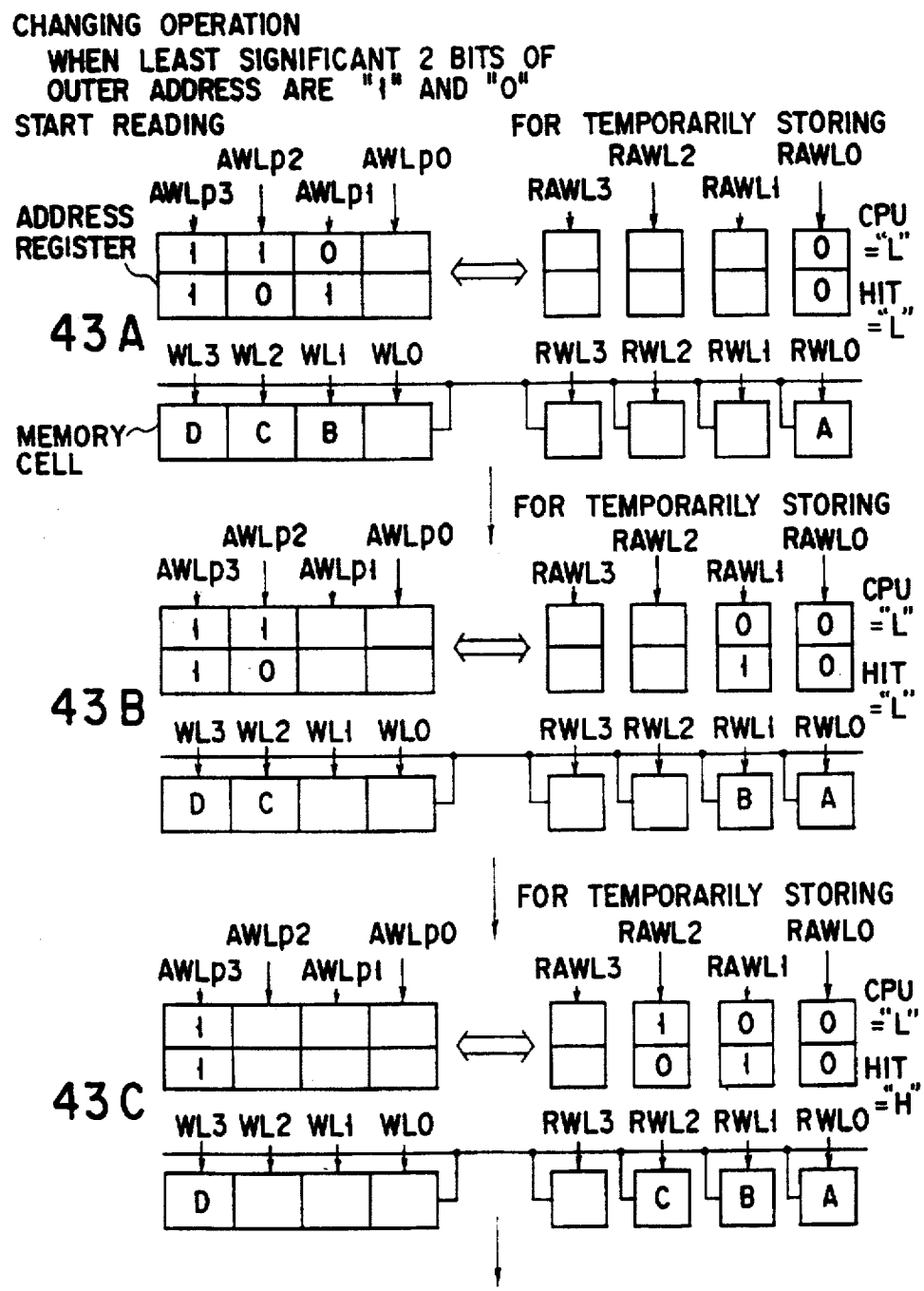

COPY OPERATION
WHEN LEAST SIGNIFICANT 2 BITS OF
OUTER ADDRESS ARE "1" AND "0"

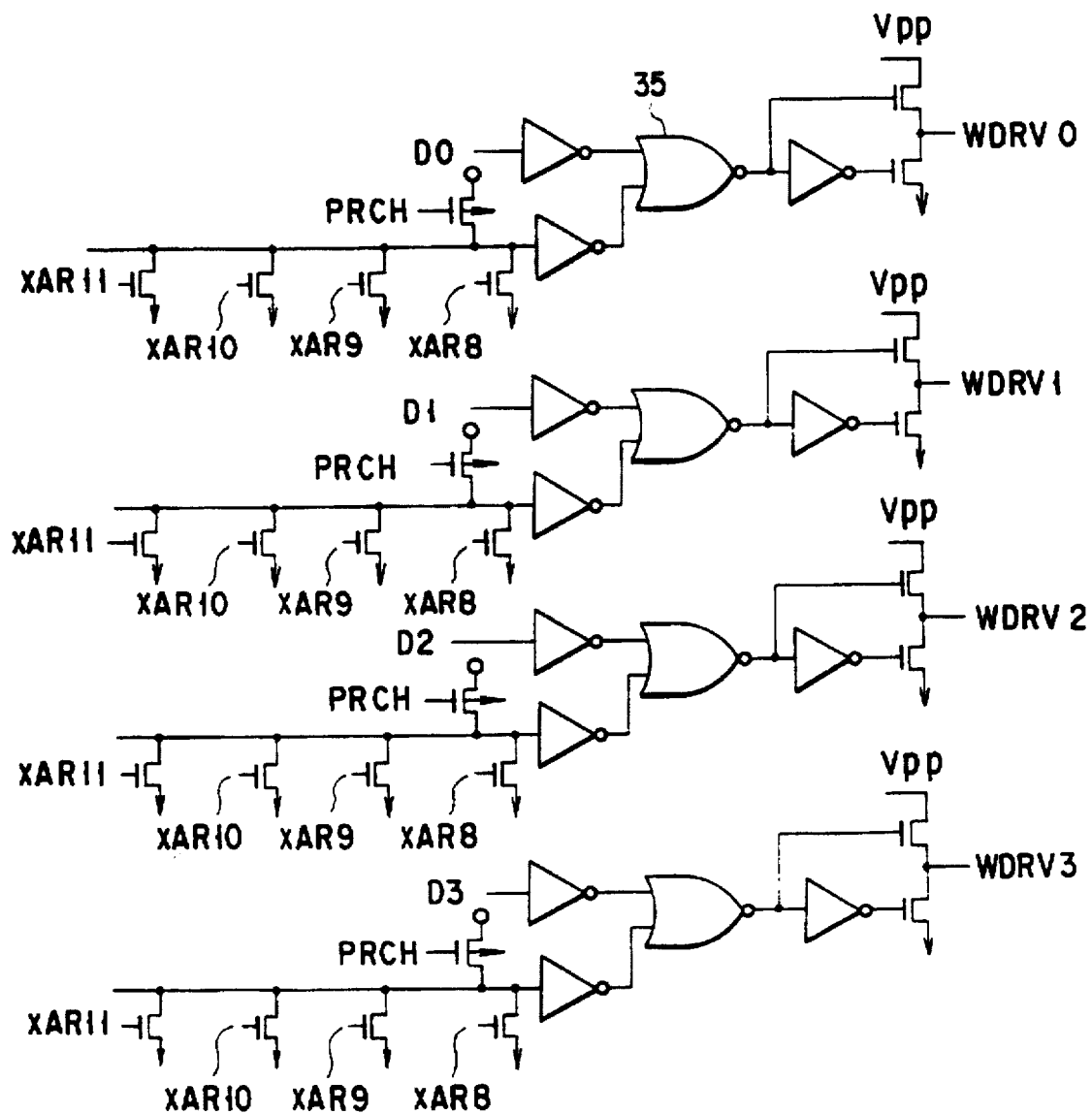
F I G. 52

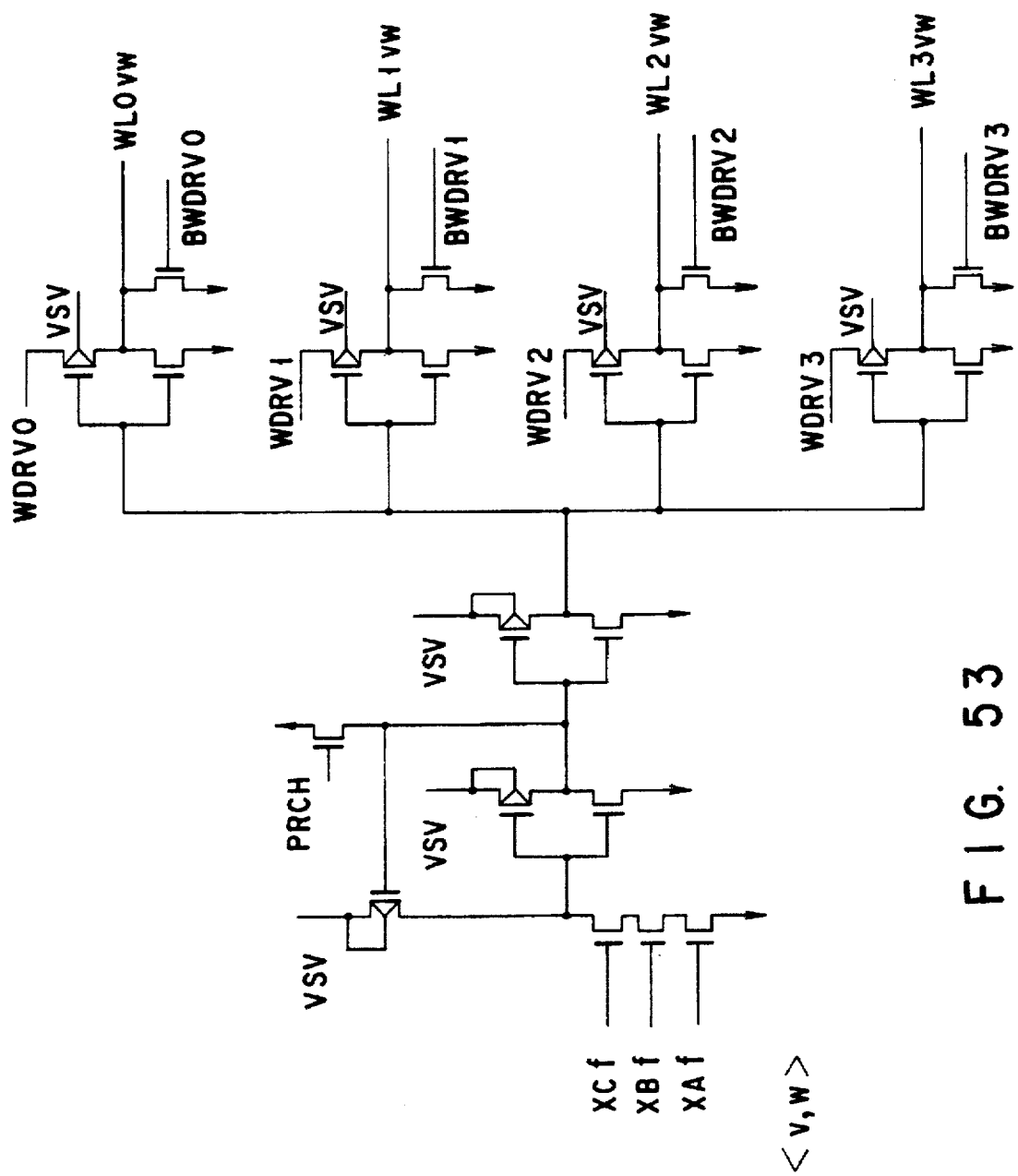
F I G. 53

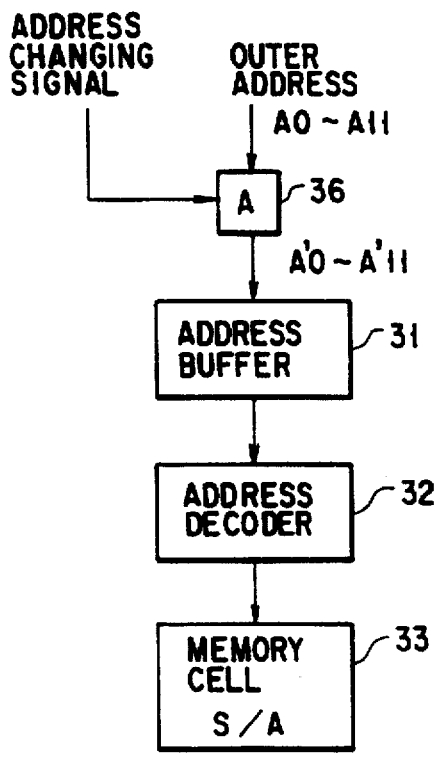
F I G. 54A
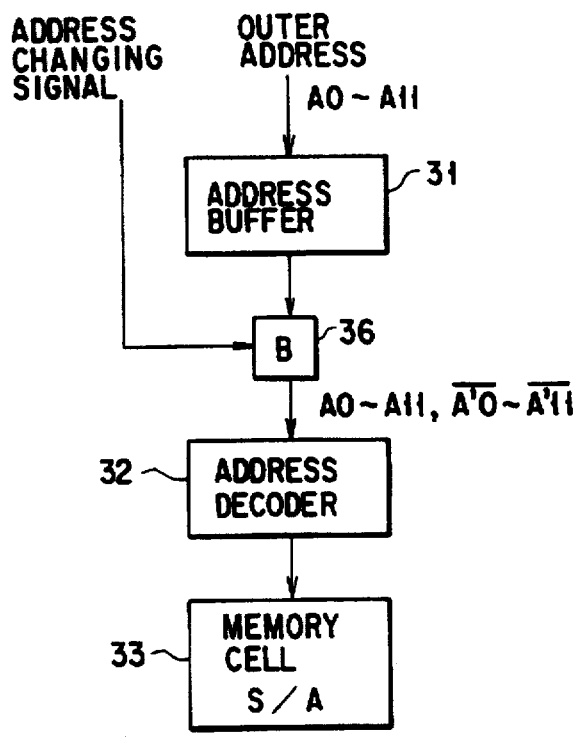
F I G. 54B
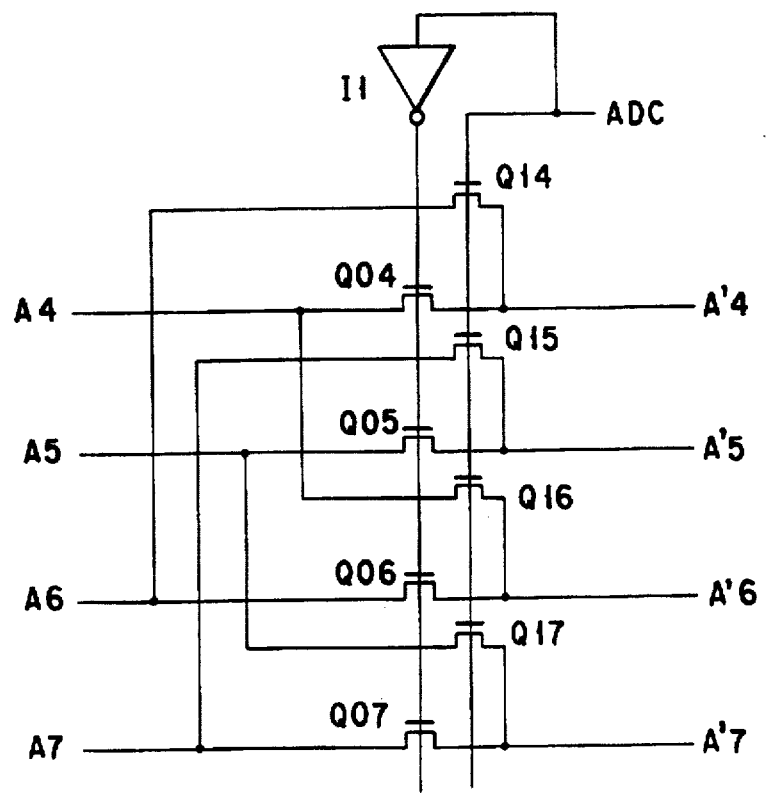
F I G. 55

SEMICONDUCTOR MEMORY DEVICE

This application is a continuation of application Ser. No. 08/364,235, filed on Dec. 27, 1994, now abandoned.

BACKGROUND OF THE INVENTION

1. Field of the Invention

The present invention relates to a dynamic semiconductor memory device (DRAM) and more particularly to a semiconductor memory device using a memory cell unit (NAND type cell) formed by connecting memory cells in series.

2. Description of the Related Art

In recent years, there has been proposed a semiconductor memory device having a memory cell unit formed by connecting a plurality of memory cells in series (IEEE ISSCC DIGEST OF TECHNICAL PAPERS, Vol. 34, p. 106 TAM6.2, 1991, IEEE ISSCC DIGEST OF TECHNICAL PAPERS, Vol. 36, p. 46 wp3.3, 1993). This type of the semiconductor memory device has an advantage in the point that a cell area can be lessened since the number of contacts with a bit line is small as compared with a case that the memory cells are not connected in series.

Conventionally, there is known a DRAM in which an NAND type memory unit is formed by connecting a plurality of cells in series and a plurality of the memory units are connected to a bit line to form a memory cell array. According to the NAND type cell array system, a cell area can be lessened since the number of contacts with a bit line is small as compared with a case that the memory cells are not connected in series.

For reading data of the memory cells far away from the bit line contact of the memory cell unit in the NAND type cell array, cell data passes through a transistor section of the memory cell on the bit line side from the memory cell. At the section where cell data is passed, data of the memory cell of the section is broken. In order to prevent the breakage of data, there is needed a register for temporarily storing data of the memory cell unit to rewrite the cell.

Then, in order to read data of the memory cell, after reading data from the memory cell to the register, data is read from the register. As a result, time, which is required to read data, becomes longer than the normal DRAM. Restoring read cell data can be performed at the same time with amplifying read data in the normal DRAM where each bit is connected to the bit line. However, in the NAND type cell array system, besides the reading cycle, a cycle for writing the register cell to the cell is needed. As a result, it also makes time which is required to read data, longer.

Moreover, in the case of writing data, after once reading data of the memory cell to the register, data to be written is written to the register, and data of the register is written to the memory cell. As a result, time which is required to write data, also becomes longer. In other words, according to the NAND type cell array system, there was a problem in that it took much time to access data.

Conventionally, in the DRAM of the NAND type cell array system, since data transfer was needed between the memory cell and the register when reading and writing data, there was a problem in that it took much time to access data.

In other words, for reading data of the memory cells far away from the bit line contact of the memory cell unit, data must be read from the nearest data in order. As a result, there was a problem in that it took much time every time when data was read.

In consideration of the above problem, the present invention has been made, and an object of the present invention is to provide a semiconductor memory device, which can shorten average access time of the memory and average cycle time as using a memory cell unit in which a plurality of memory cells are connected in series.

SUMMARY OF THE INVENTION

In consideration of the above-mentioned problem, the present invention has been made, and an object of the present invention is to provide a semiconductor memory device, which can reduce time required for reading and writing data to improve high speed of data accessing in a system in which a plurality of memory cells are connected in series to form an NAND type memory cell unit.

The outline of a first semiconductor memory device of the present invention lies in that data stored in a register is directly used in continuous reading or writing of the same address (or adjacent address).

More specifically, the first semiconductor memory device of the present invention comprises a memory cell array having a plurality of memory cell units formed by connecting a plurality of dynamic type memory cells in series, and register cells, provided in a ratio of one set to a predetermined number of memory cell units, for temporarily storing data to be read/written from/to each memory cell of the corresponding memory cell unit. In the first semiconductor memory device, a previous row address and the latest row address are compared with each other. In a case where these addresses show the same memory cell unit, not data of the memory cell but data of the register cell is directly read during reading, data to be written is written to the register cell without once reading data of the memory cell to the register during writing.

As a desirable specific form of the present invention, the following points can be explained.

(1) Data writing is performed in the same system as the normal NAND type cell array system. Then, in the case where the previous row address and the latest row address show the same memory cell unit only during reading data, not data of the memory cell but data of the register cell is directly read.

(2) Data writing is performed in the same system as the normal NAND type cell array system. Then, in the case where the previous row address and the latest row address show the same memory cell unit only during writing data, data to be written is written to the register cell without once reading data of the memory cell to the register during writing.

(3) In reading and writing data from the memory cell, a register cell for refresh is provided, besides the register cell which temporarily stores data, and the register cell for refresh is selected during refresh.

(4) The memory cell group is formed of a plurality of memory cell units, the register cells are provided in a ratio of one set to a predetermined number of the memory cell groups, and temporarily store data to be read/written from/to each memory cell of the corresponding memory cell group. In this case, if the previous row address and the latest row address show the same memory cell unit during reading data, not data of the memory cell but data of the register cell is directly read, and data to be written is written to the register cell without once reading data of the memory cell to the register during writing.

According to the present invention, in the case where the row address showing the same memory cell unit is continuously selected, data can be directly read/written from/to the register cell without accessing data to the memory cell. Therefore, transfer of cell data from the memory cell to the register cell and time required for restoring data from the register cell to the memory cell can be omitted, so that data reading and writing can be performed at a high speed. In the case where the row address showing the same memory cell unit is not continuously selected, data reading/writing is performed in the same system as the normal NAND type cell array system.

Moreover, the register cell for refresh is provided, separately from the register cell (main register cell), so that data of the main register cell is not broken at the time of refresh. Therefore, refresh can be performed without losing the advantage of the high speed performance.

According to a second semiconductor memory device of the present invention, a memory cell array having a plurality of memory cell units formed by connecting a plurality of memory cells in series, and each of the memory cell units is connected to a bit line. In the second semiconductor memory device, it is characterized in that there is provided a controlling circuit for controlling the position of data stored in the memory cell of the memory cell unit. Particularly, it is characterized in that the position of data is controlled to be stored in the memory cell which is nearest to a bit line contact of the memory cell unit.

As a desirable specific form of the present invention, the following points can be explained in the memory cell unit.

(1) The controlling circuit changes data of an arbitrary position with data of the other position in the memory cell unit.

(2) The controlling circuit copies data of the arbitrary position to the other position in the memory cell unit.

(3) The other position described in above items (1) and (2) is a position of the memory cell which is closest to the contact of the bit line.

(4) The controlling circuit for changing the position of data described in above item (1) moves data of an arbitrary memory cell of the memory cell unit to the memory cell which is closest to the contact of the bit line in the memory cell unit. Also, the controlling circuit controls data which is stored in the memory cell existing between the arbitrary memory cell and the bit line contact, to be stored in the memory cell which is sequentially shifted outward seeing from the bit line contact.

(5) There is provided a number of registers for temporarily storing data which number is a multiple of the number of the memory cells of the memory cell unit, to the array of the memory cell unit every column.

(6) Arbitrary data is data which has been most lately accessed from outside of a chip.

(7) The controlling circuit is formed on the same substrate as the memory cell.

(8) The controlling circuit is formed on the substrate, which is different from the memory cell, and used in a plurality of the memory chips in common.

(9) Data is received/transmitted to/from the outer section when data is read to the register for temporarily storing from the memory cell unit.

(10) Data is received/transmitted to/from the outer section when data is restored to the memory cell unit from the register for temporarily storing.

According to the present invention, the position of data of the memory cell unit is controlled, particularly, data which is estimated to be accessed next, is controlled to be stored at the position which is closest to the memory cell from the bit line contact. Whereby, when data is accessed next, data can be read for the shortest time. Then, there is higher possibility that data which is once read from the memory cell unit, will be read again, than other data. Therefore, data which is lately read, is stored in the memory cell closest to the bit line contact in the memory cell unit, so that data having high possibility of being read is stored in the memory cell closest to the bit line contact in the memory cell unit. Whereby, the average access time of the memory and the average cycle time can be reduced as compared with the conventional case.

The outline of third and fourth semiconductor memory devices is that possibility that data of the memory cell closest to the bit line of the memory cell unit will be accessed is improved. Among row addresses to be inputted from the outer section, a section of the row address which selects the memory cell within the memory cell unit, is provided at the upper position of the address than a section of the row address which selects each memory cell unit.

More specifically, according to the third semiconductor memory device of the present invention, a plurality of memory cell units each formed by connecting a plurality of memory cells in series are arranged in an array form, and each memory cell unit is connected to a bit line. In this semiconductor memory device, there is provided a row decoder, which is used such that a section of the row address which selects the memory cell of the memory cell unit, is provided at the upper position of the address than another section of the row address which selects each memory cell unit, among row addresses to be inputted from the outer section.

According to the fourth semiconductor memory device of the present invention, a plurality of memory cell units each formed by connecting a plurality of memory cells in series are arranged in an array form, and each memory cell unit is connected to a bit line. In this semiconductor memory device, there are provided a controlling circuit changing data of an arbitrary memory cell of the memory cell unit with data of the memory cell closest to the bit line contact in the memory cell unit, and a row decoder, which is used such that a section of the row address which selects the memory cell of the memory cell unit, is provided at the upper position of the address than another section of the row address which selects each memory cell unit, among row addresses to be inputted from the outer section.

As a desirable specific form of the present invention, the following points can be explained.

(1) There is provided a circuit for changing the corresponding relationship between an outer address and an inner address in a plurality of kinds by a signal from an outer section.

(2) The data changing circuit is used to move data of an arbitrary memory cell of the memory cell unit to the memory cell which is closest to the contact of the bit line in the memory cell unit. Also, the data changing circuit controls data which is stored in the memory cell existing between the arbitrary memory cell and the bit line contact, to be stored in the memory cell which is sequentially shifted outward seeing from the bit line contact in the memory cell unit.

(3) Arbitrary data is data which is most lately accessed from outside of a chip.

According to the present invention, among row addresses to be inputted from the outer section, the section of the row address which selects the memory cell within the memory cell unit, is provided at the upper position of the other section of the row address which selects an arbitrary memory cell unit from the plurality of memory cell units.

Whereby, possibility that data of another memory cell within the same memory cell unit will be accessed next can be reduced, and the average access time can be shortened.

The data access of the CPU has a tendency in which there is possibility that data close to the address once accessed will be accessed next. Due to this, normally, if data of the memory cell closest to the bit line contact is accessed, there is high possibility that data of the other memory cell of the same memory cell unit will be accessed next, so that it takes much time to access data. Therefore, as in the present invention, the reduction of possibility that data of the same memory cell unit will be accessed next can result in shortening access time.

Moreover, the plurality of the corresponding relationships between the outer address and the inner address are provided, and any one of these corresponding relationships can be selected by the outer signal. Whereby, the correspondence between the outer address and the inner address can be selected for much shorter time by the outer signal.

Furthermore, the present invention can be more effectively used by combining with the system in which position of data is controlled such that data which has high possibility of being accessed next, is stored in the memory cell closest to the bit line contact in the memory cell unit.

More specifically, in the data access, in the normal case, the upper address is the same and the lower address is continuously changed. Therefore, if the lower address selects each memory cell unit and the upper address selects the memory cell within the memory cell unit, read data selects one memory cell from the plurality of the memory cell units, thereby making it possible to store all read data in the memory cell closest to the bit line contact in the memory cell unit. In contrast, as in the conventional case, if the lower address selects the memory cell within the memory cell unit and the upper address selects each memory cell unit, read data selects the plurality of the memory cells or all memory cells from the arbitrary memory cell unit. As a result, all read data cannot be stored in the memory cell closest to the bit line contact in the memory cell unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit structural view showing an NAND type DRAM of a first embodiment of the present invention;

FIG. 10 is a circuit structural view showing an NAND type DRAM of a third embodiment of the present invention;

FIG. 11 is a circuit structural view showing an NAND type DRAM of the third embodiment of the present invention;

FIG. 12 is a circuit structural view showing an NAND type DRAM of a fourth embodiment of the present invention;

FIG. 13 is a circuit structural view showing an NAND type DRAM of a fifth embodiment of the present invention;

FIG. 14 is a circuit structural view showing an NAND type DRAM of the fifth embodiment of the present invention;

FIG. 15 is a block diagram showing a schematic structure of a semiconductor memory device of a sixth embodiment of the present invention;

FIGS. 19A and 19B are views showing a circuit for controlling timing of the word line of the sixth embodiment of the present invention;

FIGS. 20A and 20B are views showing a circuit for controlling timing of RWL0 to 3 of the sixth embodiment of the present invention;

FIG. 21 is a view showing an operation timing of the circuit of FIGS. 17A to 17D;

FIG. 22 is a view showing an operation timing of the circuit of FIGS. 18A to 21;

FIG. 28 is a view showing a specific structure of a copy/changing selection circuit used in the data changing control circuit;

FIG. 29 is a view showing an operation timing in a case where data is refreshed;

FIG. 30 is a view showing an operation timing in a case where data is changed;

FIG. 33 is a view showing an operation timing in a case where data is copied;

FIG. 36 is a view showing a specific structure of a row decoder;

FIGS. 39A to 39C are views showing a specific structure of an address buffer;

FIGS. 40A and 40B are views showing a specific structure of a decoder;

FIGS. 41A and 41B are views showing a specific structure of an I/O controlling circuit;

FIGS. 43A to 43C are views showing a state of data movement in a case where data is changed;

FIG. 52 is a circuit structural view showing a WDRV driver used in the eighth embodiment of the present invention;

FIG. 53 is a circuit structural view showing a row decoder used in the eighth embodiment of the present invention;

FIGS. 54A and 54B are block diagrams showing a schematic structure of a semiconductor memory device of a ninth embodiment of the present invention; and FIG. 55 is a circuit structural view showing a specific example of an address switching circuit.

DETAILED DESCRIPTION OF THE PREFERRED EMBODIMENTS

Figure 2:
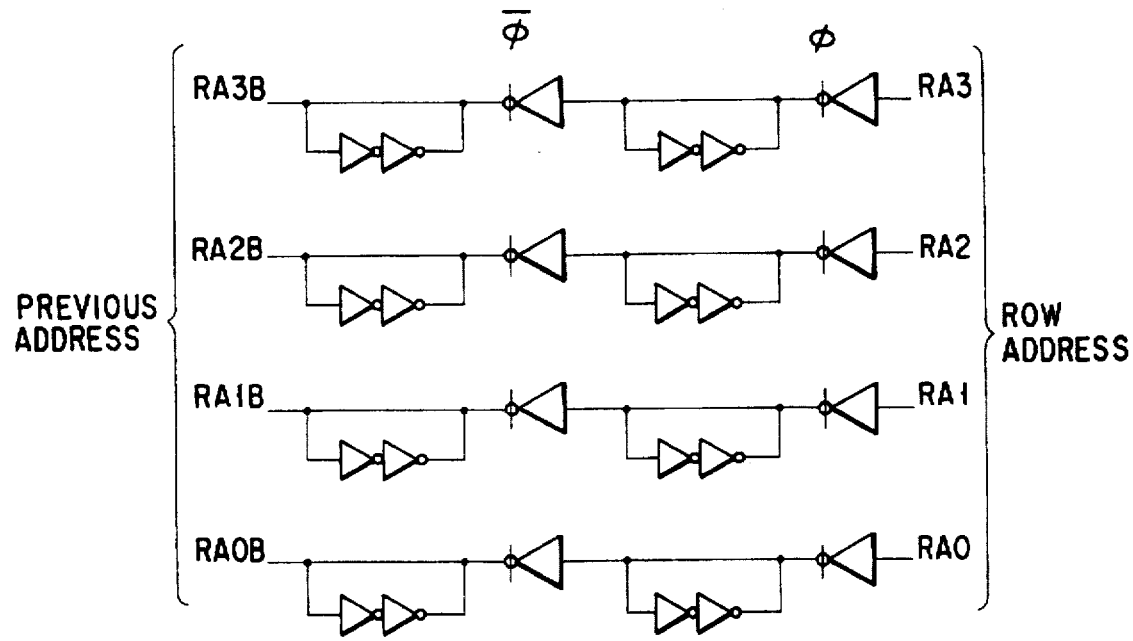
FIG. 2 is a view schematically showing the structure of a row address latch circuit used in the first embodiment of the present invention.

Embodiments of the present invention will be explained with reference to the drawings.

(First Embodiment)

FIG. 1 is a view showing a circuit structure of a DRAM of a first embodiment of the present invention. This embodiment shows a case in which a memory cell unit is formed by connecting two memory cells in series. However, the number of memory cells to be connected in series can be suitably changed.

In FIG. 1, word lines to two memory cells C0 and C1 are respectively set to WL0 and WL1, register cells in which cell data is stored are set to RC0 and RC1, and register word lines, serving as selection lines for register cells are set to RWL0 and RWL1. A sense amplifier (S/A) 6 and an equalizer (EQL) 7 are connected to one end of a bit line BL, to which a memory cell unit formed of memory cells C0 and C1 is connected. Moreover, a selection gate, which is driven by φT, is inserted in the middle of the bit line BL.

It is noted that a sense system is an open bit line system, and bit lines BL, /BL are provided at both sides of the sense amplifier 6. Moreover, a plurality of the memory cell units (not shown) are connected to the bit line BL, and a plurality of columns, one of which line structures shown in FIG. 1, are provided in a direction of the word lines.

The above-mentioned structure is the same as the normal NAND type cell array system. However, this embodiment is characterized in the driving method by circuits 1 to 5 shown in the block diagram. More specifically, a row address is inputted to a row address latch circuit 1 and a row address comparator 2, and a decoder selection circuit 3 selectively drives a row decoder 4 and a decoder 5 for register cell based on an output of the row address comparator 2. Then, the word lines WL0 and WL1 are driven by the row decoder 4, and the register word lines RWL0 and RWL1 are driven by the decoder 5 for register cell.

Figure 3:
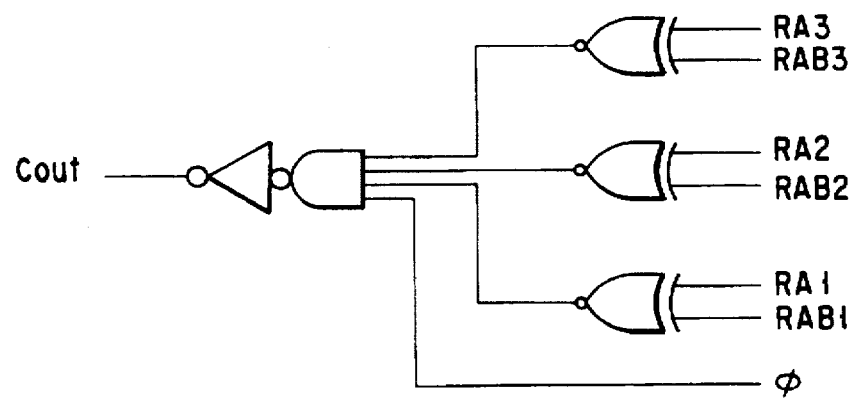
FIG. 3 is a view showing the specific structure of a row address comparator used in the first embodiment of the present invention.

The row address latch circuit 1 is a circuit for holding a previous row address, and structured as schematically shown in FIG. 2. Here, the row addresses are four bits of RA0, RA1, RA2, RA3, and high order three bits, that is, RA3, RA2, and RA1 show row addresses of the unit cell, and the least significant bit RA0 shows a row address of the cell of the unit cell. In other word, this shows a case in which two cells are provided in one unit cell. However, it is not always necessary to latch RA0. The row address comparator 2 is a circuit for comparing previous row addresses, which is held in the row address latch circuit, with new row addresses when the new row addresses are inputted at a next cycle. The row address comparator 2 is structured as shown in FIG. 3. Here, there can be obtained Cout="H" when all addresses (RA1 to RA3) coincides with (RAB1 to RAB3) under a condition of φ="H".

Figure 4:
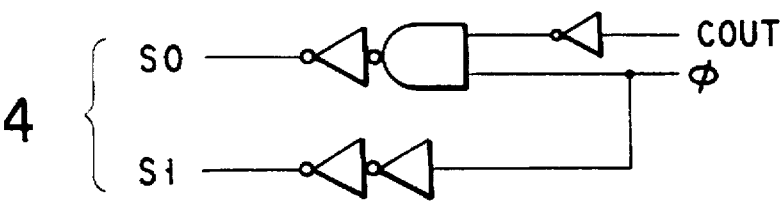
FIG. 4 is a view showing the specific structure of a decoder selection circuit used in the first embodiment of the present invention.

The decoder selection circuit 3 is structured as shown in FIG. 4. If the new addresses are different from the previous addresses, the decoder selection circuit 3 selects a signal S0, which drives the row decoder 4, and a signal S1, which drives the decoder 5 for register cell. Then, the decoder selection circuit 3 selects only the signal S1 if the new addresses are the same addresses as the previous addresses. In this case, the signal S0 is set to "H" only when Cout="L" and φ="H".

Figure 5:
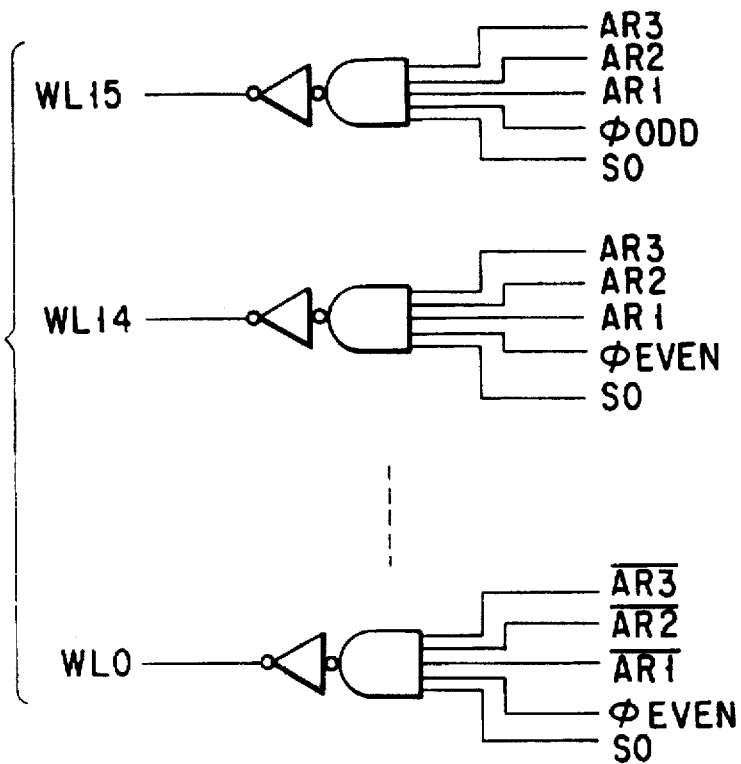
FIG. 5 is a view showing the specific structure of a row decoder used in the first embodiment of the present invention.
Figure 6:
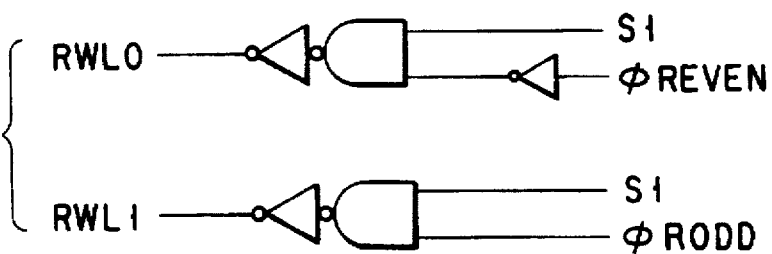
FIG. 6 is a view showing the specific structure of a decoder for register cell used in the first embodiment of the present invention.

The row decoder 4 is structured as shown in FIG. 5. The row decoder 4 is used to selectively drive the word line WL of the memory cell. The decoder 5 for register cell is structured as shown in FIG. 6. The decoder 5 for register cell is used to selectively drive the register word line RWL.

According to the above-mentioned structure, the inputted new row addresses and the previous row addresses are compared with each other by the row address comparator 2. If both addresses do not select the same word lines (WL0, WL1) by the decoder selection circuit 3, the row decoder 4 and the decoder 5 for the register cell perform the normal operations.

In other words, the word lines corresponding to the addresses are applied with voltage by the row decoder 4, and data is read from the memory cell close to the bit line contact in order. If read data is amplified by the sense amplifier 6, the register word line corresponding to each address are applied with voltage by the decoder 5 for register cell, and data of the memory cell is written to the register cell. After the reading data from all memory cells connected to the NAND type unit and the storing data to the register cell are finished, data is restored to NAND cell from the register cell, and the word lines fall from the word line far away from the bit line contact in order.

Similarly, in the writing operation, the word line rises in order, data is stored in the register cell, data is written to an objective cell, and data is restored from the register cell.

If the addresses, which sequentially select the same word lines (WL0, WL1), are inputted, the decoder selection circuit 3 selects only the signal S1. At this time, the row decoder 4 does not operate. On the other hand, the decoder 5 for register cell directly selects the register word line of the register cell in which data corresponding to the addresses is stored, so that data is read from the register cell.

At this time, similar to the case of the cell data reading and restoring, the sense amplifier 6 is operated to amplify data of the register cell, and restore data to the register cell. The restoring data from the register cell to the memory cell is performed sequentially after reading data from the register cell.

After data is transferred to a DQ line, the pair of the bit lines is equalized. However, at this time, RWL is set to "L", and data of the register cell does not equalize. Whereby, even if the same row addresses are inputted again, data can be read from the register cell.

In the case of writing, if the same word line WL, which is the same as data stored in the register cell, is selected, data may be directly written to the register, and restore data to the memory cell. As a result, time for once moving data to the register cell from the memory cell can be omitted.

In the case of writing, in equalizing the pair of the bit lines, RWL is set to "L", and data of the register cell does not equalize. Whereby, even if the same row address is inputted again, data can be read from the register cell.

Figure 7:
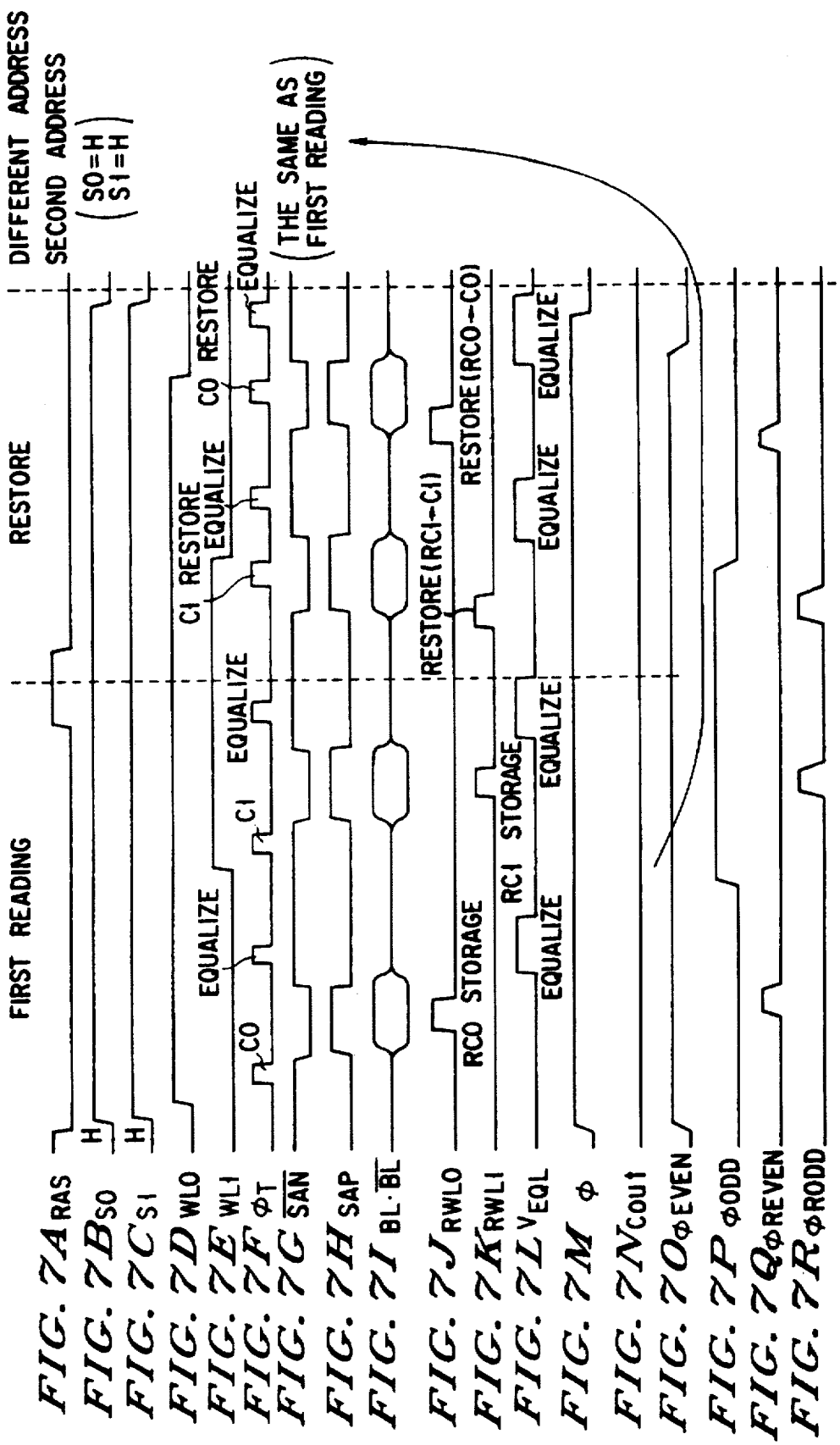
FIG. 7 is a view of a signal waveform for explaining a reading operation in the first embodiment of the present invention.
Figure 8:
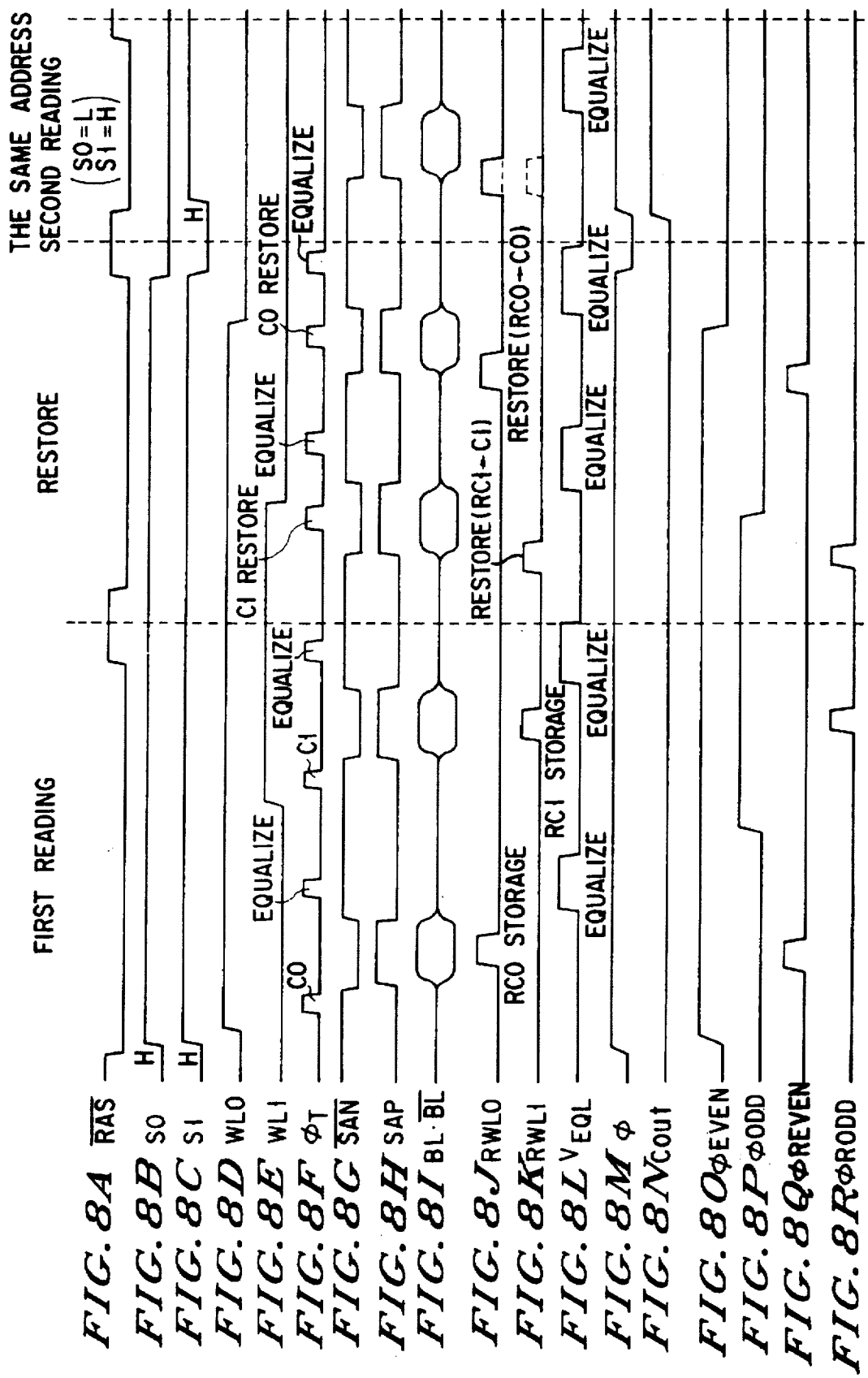
FIG. 8 is a view of a signal waveform for explaining a reading operation in the first embodiment of the present invention.

The waveform view in the case of the reading of the first embodiment is shown in FIGS. 7 and 8. FIG. 7 shows the case in which different row addresses are read after the first reading. In this case, the second reading is performed in the same manner as the first reading. Then, after the second reading, the data restoring is performed in the same manner as the data restoring after the first reading.

FIG. 8 shows the case in which the same row address is read after the first reading. In this case, it is not needed that data of the memory cell be transferred to the register cell. Data is directly read from the register cell. Due to this, time, which is required to read data, becomes shorter than the first reading. Therefore, time, which is required to read data, can be largely reduced.

The case to which the reading system of FIG. 8 can be applied is not only a case in which the two addresses are completely the same but also a case in which the upper three bits of each of the addresses are the same, that is, the addresses showing the same memory cell unit.

Moreover, though it is not shown in the figure, in the writing, in a case where a new address is the same as the previous address, data of the memory cell is already stored in the register cell. Due to this, it is possible to omit the data transfer to the register cell from the memory cell. Therefore, data to be written can be directly written to the register cell, so that time, which is required to write data, can be reduced.

As mentioned above, according to this embodiment, in the case where the row address showing the same memory cell unit is continuously selected, data can be directly read from the register cell without accessing data to the memory cell, or data can be directly written to the register cell. Due to this, transfer of cell data from the memory cell to the register cell and time which is required to restore data from the register cell to the memory cell, can be omitted, and data access time can be largely reduced.

(Second Embodiment)

A DRAM of a second embodiment of the present invention will be explained as follows.

The second embodiment shows a case in which the restoring data from the register cell to the memory cell in the first embodiment is not performed until the address of the next word line is shown.

Figure 9:
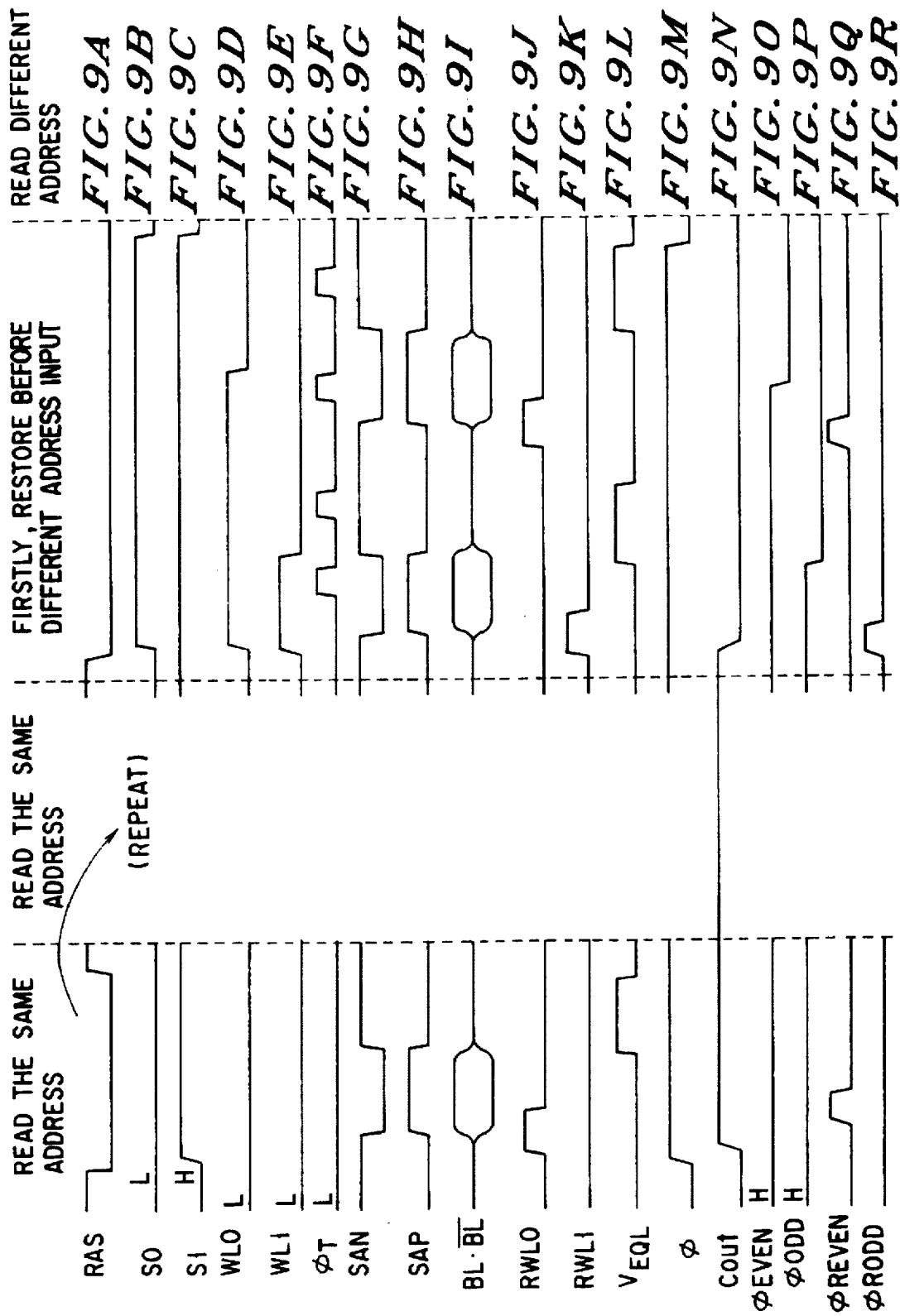
FIG. 9 is a view of a signal waveform for explaining a reading operation in a second embodiment of the present invention.

FIG. 9 shows the waveform view of the case of the reading in this embodiment. Similar to the first embodiment, in the second embodiment, the row address latch circuit 1 holds the previous row address and the row address comparator 2 compares the previous row address with a new address when the new address is inputted at a next cycle. If the new row address differs from the previous address, the restoring from the register cell to the memory cell is performed, and the reading cycle of the new address is started. If the row address in which the same word lines (WL0, WL1) are continuously selected is inputted, the restoring is not performed. The decoder 5 for register cell selects the register word line of the register cell to which data corresponding to the address is stored, and reads data from the register cell.

At this time, similar to the case when cell data is read and the restoring is performed, the sense amplifier operates to amplify data of the register cell and restore data to the register cell.

After data is transferred to the DQ line, the pair of the bit lines is equalized. However, at this time, RWL is set to "L", and data of the register cell does not equalize. Whereby, even if the same row addresses are inputted again, data can be read from the register cell.

In the case of writing, if the same word line WL, which is the same as data stored in the register cell, is selected, data may be directly written to the register cell. When the different row address is inputted, data which is already written to the register cell, is restored in the memory cell. As a result, time for once moving data to the register cell from the memory cell can be omitted.

In a case where the different word line WL is selected, data which is presently stored in the register cell, is firstly restored to NAND cell, and then read out data from the selected WL and write them in.

In equalizing the pair of the bit lines after writing, RWL is set to "L", and data of the register cell does not equalize. Whereby, even if the same row address is inputted again, data can be read from the register cell.

Also, according to the second embodiment, the contents of the register cell are restored in the corresponding memory cell before a refresh cycle is started.

(Third Embodiment)

FIGS. 10 and 11 are views showing the circuit structure of a DRAM of a third embodiment of the present invention. FIG. 10 shows a case in which the register cell and the sense amplifier are shared by use of the plurality of pairs of bit lines in the first embodiment. In the figure, two bit lines share the register cells and the sense amplifier. However, any number of bit lines may be used.

FIG. 11 shows a case in which the sense amplifier is shared by use of the plurality of pairs of bit lines including the register cell in the first embodiment. In the figure, two bit lines share the sense amplifier. However, any number of bit lines may be used.

Even in this embodiment, in the case where the row address showing the same memory cell unit is continuously selected, it is possible to omit the data transfer between the memory cell and the register cell similar to the first embodiment. Whereby, data access time can be largely reduced. In this embodiment, the memory cell unit which comprises C0 and C2, and the memory cell unit which comprises C1 and C3, are formed as the same group, and the register cells RC0 to RC3 are made to correspond to the group. Due to this, the above-mentioned system can be used to not only the case in which the row address showing the same memory cell unit is continuously selected but also the case in which the row address showing the same memory cell group is continuously selected.

An operation of FIG. 10 will be explained as follows.

(1) First of all, WL0 is set to "H", and φT0 is turned on, so that data of cell C0 is transferred to an S/A side. Then, φT0 is turned off, and amplified by S/A. RWL0 is turned on, so that cell C0 is written to RC0. RWL0 is turned off, and S/A operation is ended, and the bit lines are equalized.

(2) φT1 is turned on, so that data of cell C1 is transferred to the S/A side. S/A operates and amplifies, and RWL1 is turned on, so that C1 is written to RC1. RWL1 is turned off. S/A operation is ended. The bit lines are equalized.

(3) Both φ0 and φ1 are turned on, and all BL0, BL1 and BL are equalized.

(4) The operations (1) to (3) are repeated again, and data of cell C2 is written to RWL2, and data of cell C3 is written to RWL3.

(Fourth Embodiment)

FIG. 12 is a view showing the circuit structure of a DRAM of a fourth embodiment of the present invention. RC0 and RC1 are register cells for temporary storage, ReC0 and ReC1 are second register cells for refresh, RWL0 and RWL1 are selection lines for register cell, and ReWL0 and ReWL1 are selection lines of the register cell for refresh.

In this embodiment, data of the memory cell is stored in the register cell for refresh at the time of refresh, amplified by the sense amplifier, and stored in the memory cell. Therefore, data of the register cells for temporary storage can be accessed even after the refresh without data in the register cells for temporary storage being broken.

(Fifth Embodiment)

FIGS. 13 and 14 are views showing the circuit structure of a DRAM of a fifth embodiment of the present invention. FIG. 13 shows a case in which the register cell and the sense amplifier are shared by use of the plurality of pairs of bit lines in the fourth embodiment. In the figure, two bit lines share the register cell and the sense amplifier. However, any number of bit lines to be shared may be used.

FIG. 14 shows a case in which the sense amplifier is shared by use of the plurality of pairs of bit lines including the register cell in the fourth embodiment. In the figure, two bit lines share the sense amplifier. However, any number of bit lines to be shared may be used.

The fifth embodiment is a combination of the third and fourth embodiments, and the advantages as explained in each of the embodiments can be obtained.

As mentioned above, according to the first to fifth embodiments, in the case where the row address showing the same memory cell unit is continuously inputted twice or more, the data can be directly accessed to the register cell to be read and written, so that high speed data access can be realized.

(Sixth Embodiment)

This embodiment explains that data which is expected to be accessed, is regarded as data which has most lately accessed. This is based on the point that there is high possibility that data which is once accessed, and data of the address in the vicinity of the accessed data will be next accessed. However, the concept of the present invention is not limited to this embodiment. If the CPU designates next accessing data, data may be controlled to be moved to a position close to the bit line contact of the memory cell unit.

FIG. 15 is a block diagram showing the schematic structure of a semiconductor memory device of a sixth embodiment of the present invention. In the figure, reference numeral 1 is an NAND type cell array in which memory cell units to be described later are arranged in an array form, 2: a sense amplifier for reading and writing data and equalizing circuit, 3: a temporarily storing cell, 4: a row address buffer, 5: a row decoder, 6: a core controlling circuit, 7: a register row decoder, 8: a column address buffer, 9: a column decoder, 10: an I/O buffer, 11: an I/O controlling circuit, 12: a control pulse generating circuit, and 13: a data changing controlling circuit. The respective circuits are arranged on the same substrate as a memory chip.

Figure 16:
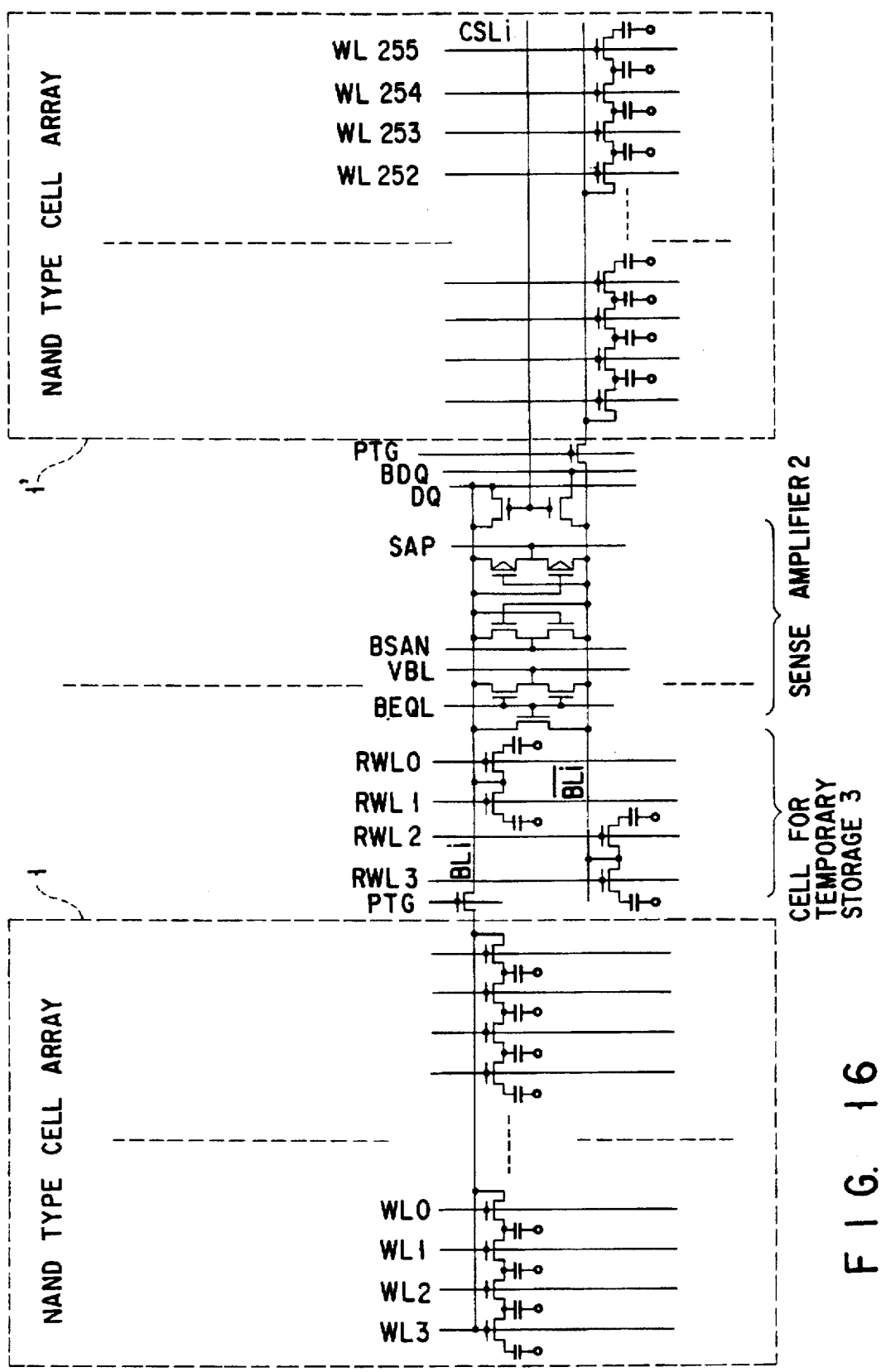
FIG. 16 is a view showing a specific structure of a memory cell unit used in the sixth embodiment.
Figure 17A:
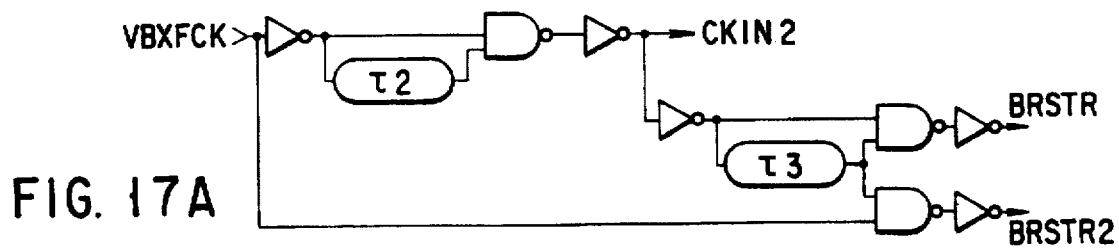
FIGS. 17A to 17D are views showing a circuit for providing timing for controlling a sense amplifier of the sixth embodiment, a word line for temporarily storing cell, and a transfer gate between a cell array and the sense amplifier.
Figure 17B:
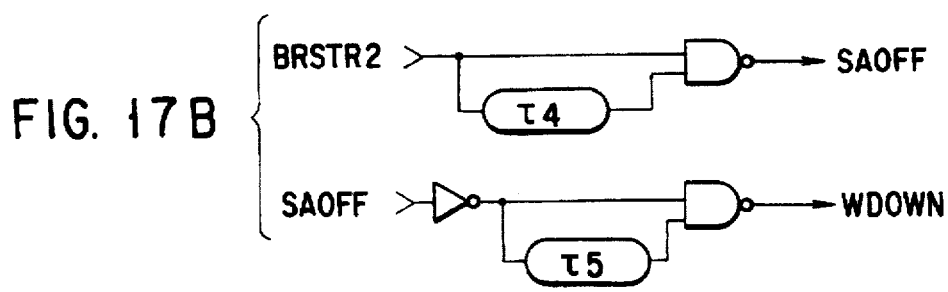
Figure 17C:
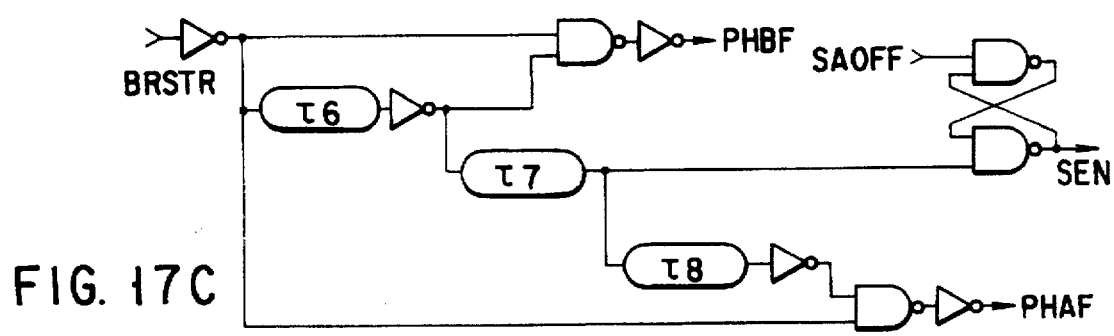
Figure 17D:
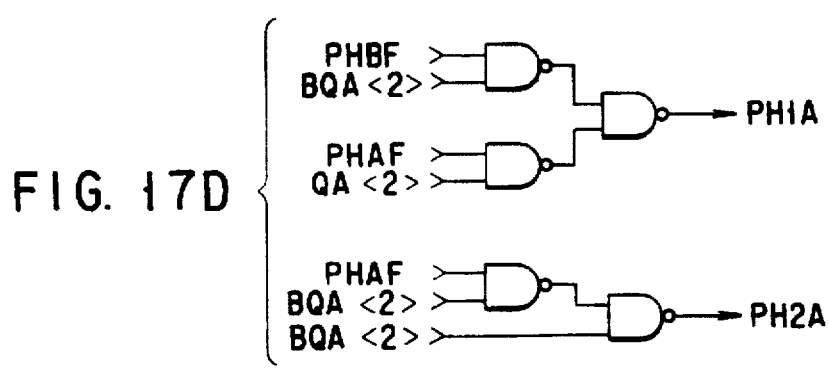

In this embodiment, a dynamic type memory cell is used as a memory cell. As shown in FIG. 16, four memory cells are connected in series. Whereby, the memory cell unit, which is expressed by the NAND type cell in this embodiment, is formed, and arranged in an array form. Although it is assumed that the memory capacity is 64 k bits in this embodiment, the present invention can be applicable to other size of memory capacity. In the sense amplifier section 2, four dynamic type cells are arranged as temporarily storing cell, which is needed in the NAND type cell, so as to temporarily store read data.

In this embodiment, the change of the position of data of the memory can be realized by changing the order of which the word lines (RWL0 to RWL3) of the temporarily storing cell 3 are activated. In other words, normally, data rewriting is performed in order opposite to the read order. However, according to this embodiment, the order of the rewriting controls the word lines RWL0 to RWL3 such that data accessed to the outer section is finally written.

In conventional, the data of the farthest memory cell from a bit line was read to the sense amplifier, amplified, and directly rewritten to the original cell. Due to this, reading was realized even if the number of the temporarily storing cells is smaller than that of the cells of the memory cell unit, by one. However, according to this embodiment, since cells for temporarily storing the last data are needed, the number of temporarily storing cells, which is the same as that of the cells of the memory cell unit, is always needed.

The data changing controlling of this embodiment is performed by the control pulse generating circuit 12 and the data changing controlling circuit 13. FIGS. 17A to 20B show the specific circuit structure of the control pulse generating circuit 13. VBRAS and VBXFCK are used as a basic clock from the outer section. VBRAS is mainly used to reset the inner circuit and to fetch an address. VBXFCK is a signal to obtain timing for reading and writing each data of the memory cell unit.

FIGS. 17A to 17D show circuits for obtaining timing for controlling the sense amplifier 2 from VBXFCK and the word lines (RWL0 to RWL3), and the transfer gate between the cell array 1 and the sense amplifier 2. FIG. 21 shows a timing view of the typical signal. In this figure, WDOWN is used to obtain timing of the bit line equalize, and PHAF and PHBF are used to obtain timing for controlling the word line of the temporarily storing cell 3 and the transfer gate between the cell array 1 and the sense amplifier 2. SEN is used to obtain timing of the sense amplifier 2.

Figure 18A:
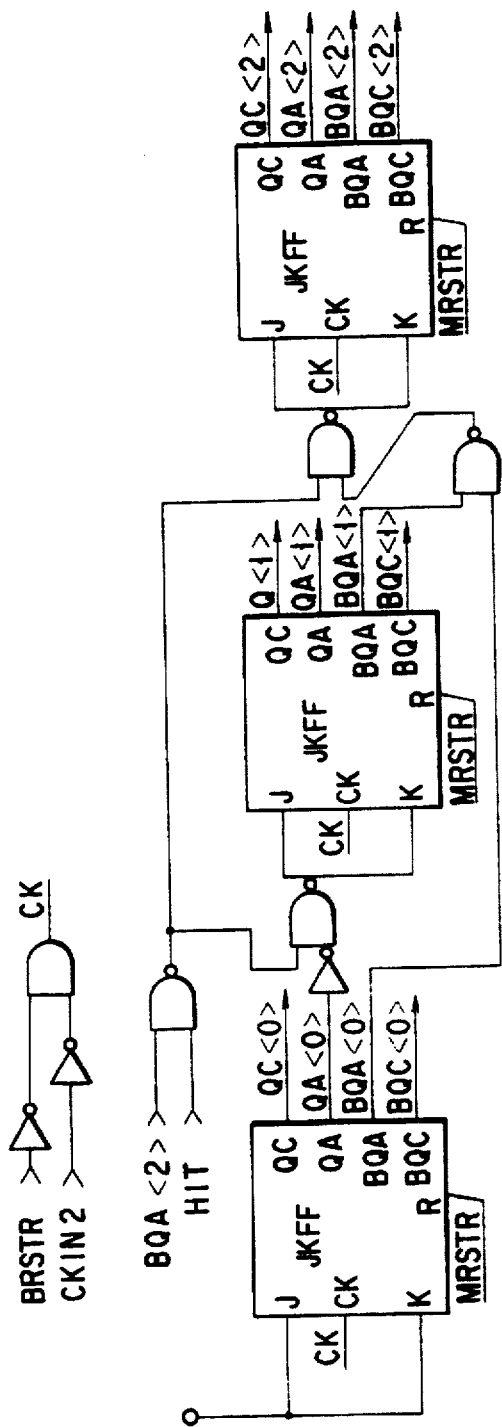
FIGS. 18A and 18B are views showing a counter circuit using a JK flip-flop and a reset circuit so as to control timing of WLj of the sixth embodiment of the present invention and that of RWL0 to 3.
Figure 18B:
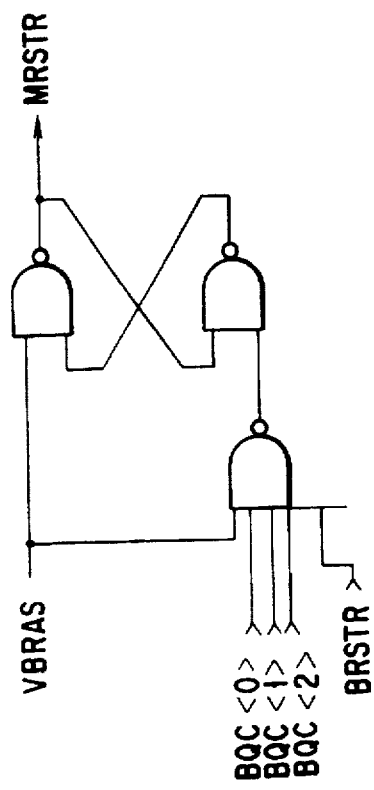

Timing of the word line (WLj) and that of RWL0 to RWL3 are controlled by a counter circuit using a JK flip-flop shown in FIG. 18A. In this figure, QA and BQA show outputs of a slave stage, QC and BQC show outputs of a master stage, and R shows a reset terminal. The timing is shown in FIG. 22. A circuit shown in FIG. 18B is used as a reset. Identification between reading and writing can be performed by the most significant bits "0" (reading) and "1" (writing) of the counter. In a case where the present internal address is consistent with the outer address, an HIT signal of the counter becomes "1", and sets the most significant bit of the counter to "1". Then, if the next VBXFCK is inputted, the HIT signal starts writing.

FIG. 19A shows a circuit for controlling timing of the word line, and FIG. 19B shows its truth table. FIG. 20A shows a circuit for controlling timing of RWL0 to RWL3, and FIG. 20B shows its truth table. Also, FIG. 22 shows the operation timing of these circuits.

Figure 23:
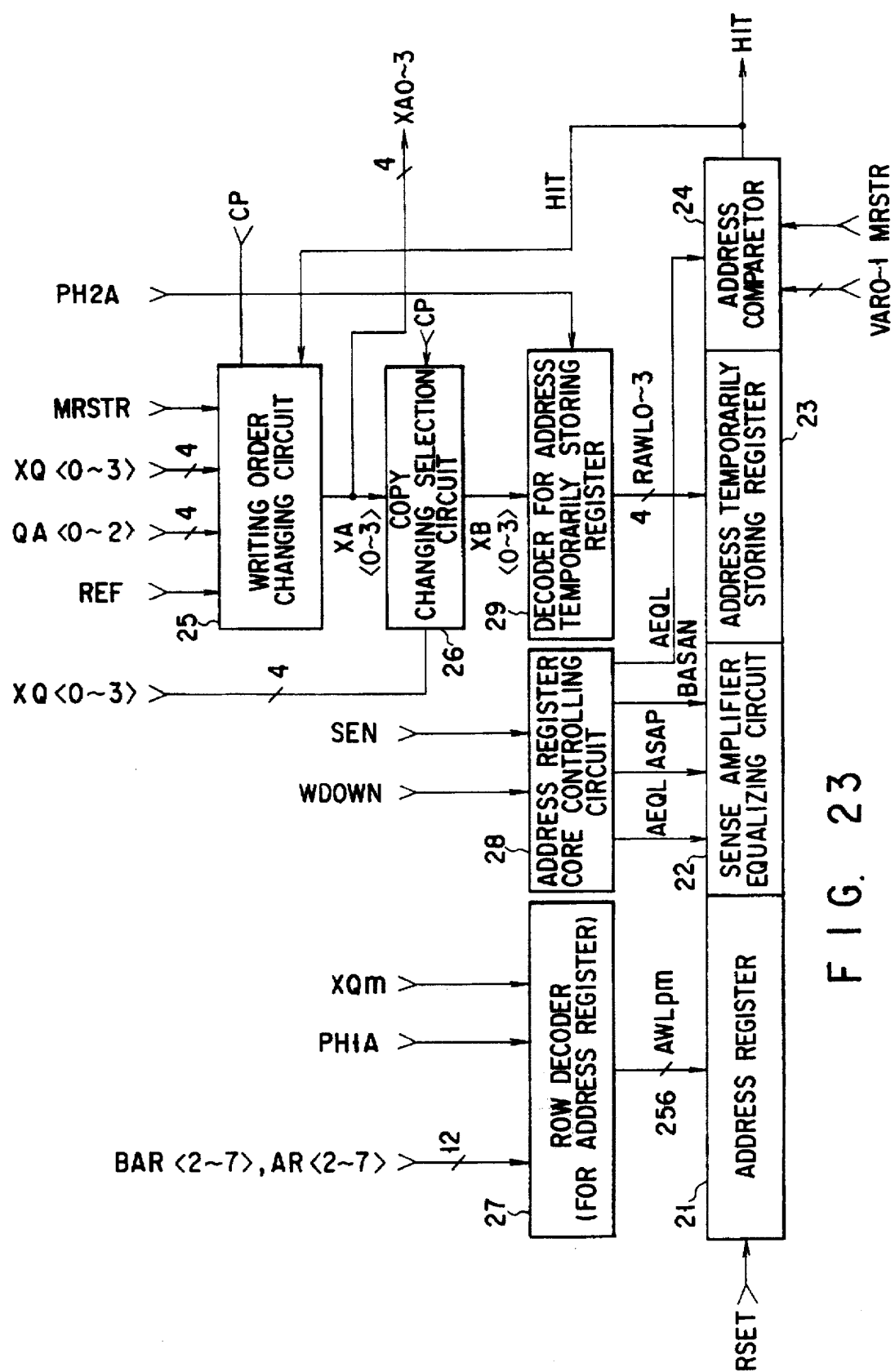
FIG. 23 is a block diagram showing a specific structure of a data switching control circuit of the sixth embodiment of the present invention.

FIG. 23 is a block diagram showing the more detailed structure of the data changing controlling circuit 13. The data changing controlling circuit 13 comprises an address register 21, a sense amplifier/equalizing circuit 22, an address temporarily storing register 23, an address comparator 24, a writing order changing circuit 25, a copy/changing selection circuit 26, a row decoder for address register 27, an address register core controlling circuit 28, and a decoder 29 for address temporarily storing register. The address register 21 stores the address of data of the memory cell unit. The sense amplifier/equalizing circuit 22 is used to read the address. The address temporarily storing register 23 is used to temporarily store the read address. The address comparator 24 is used to compare the address from the outer section with the address read from the address register 21. The writing order changing circuit 25 is used to control to change the order of writing the address to the memory cell from the temporarily storing cell when the addresses are conformed to each other. The copy/changing selection circuit 26 is used to select a case in which data of the unit is changed in the unit and a case in which data of the unit is copied.

Figure 24:
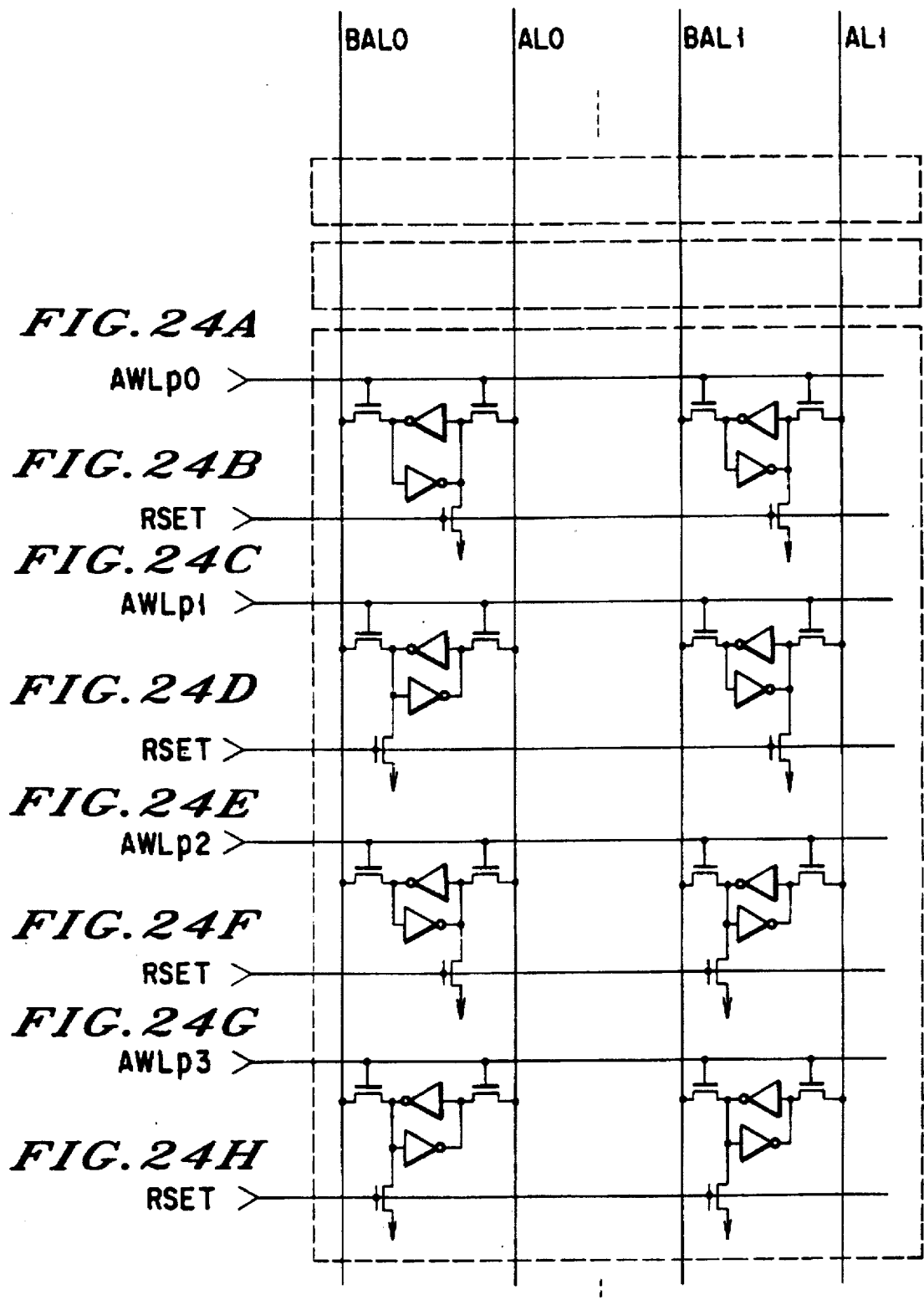
FIG. 24 is a view showing a specific structure of an address register used in the data changing control circuit.

FIG. 24 shows the specific circuit of the address register 21. The number of bits of the register is determined by the number of the cells in series in the memory cell unit. In this embodiment, since the number of the cells in series is four, the register of 2 bit (2×2=4) per one cell unit is prepared, and the address of the cells of one memory cell unit is stored based on four data as one unit, and it is needed that the number of such units is 64 (corresponding to the number of memory cell units for independently controlling). In this case, a RSET signal is a signal, which sets the content of the register to an initial value (00, 01, 10, 11), and becomes "H" when power is turned on.

Figure 25:
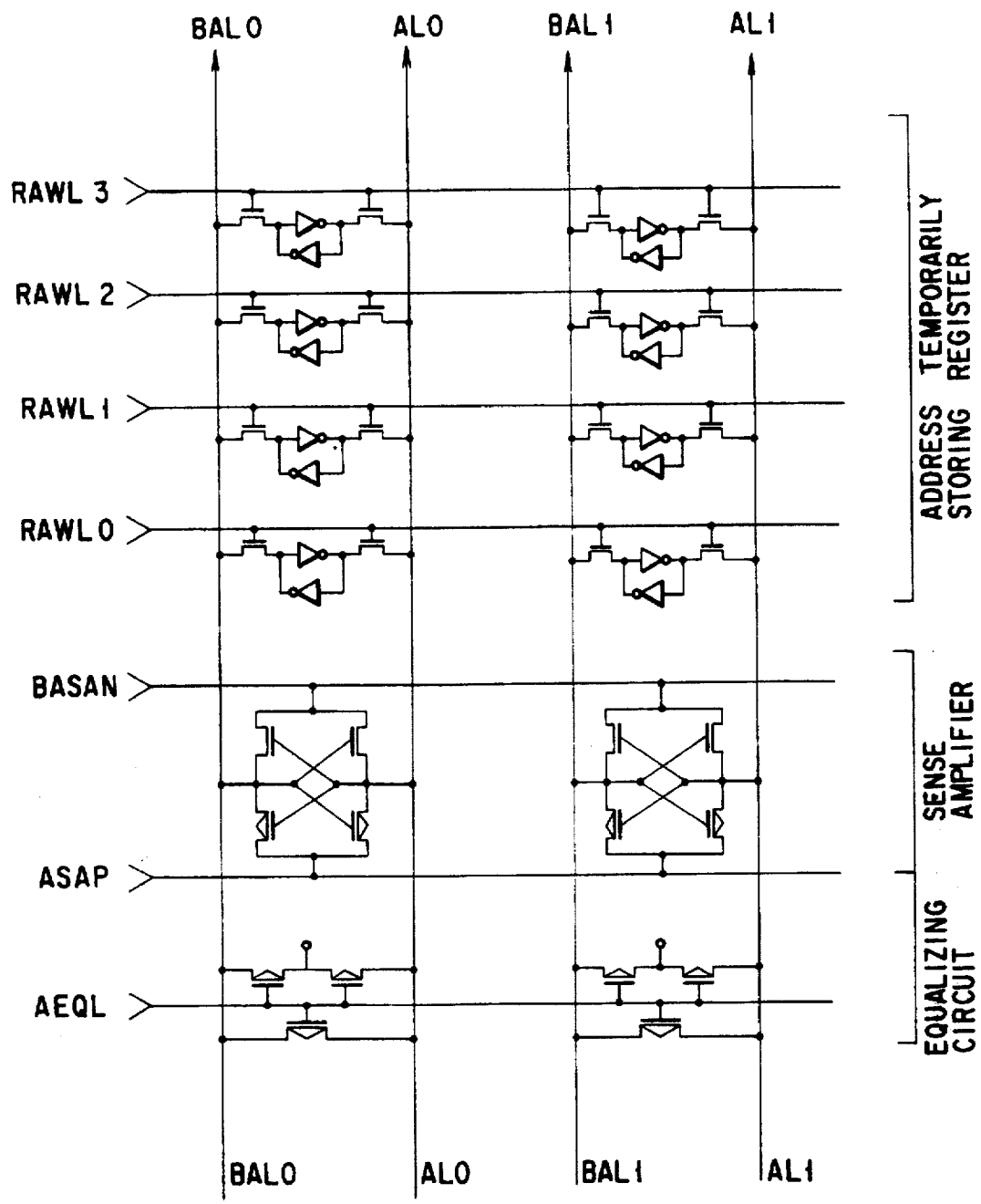
FIG. 25 is a view showing a specific structure of the sense amplifier, that of an equalizing circuit, and that of an address temporarily storing register used in the data changing control circuit.

FIG. 25 shows the specific structure of the sense amplifier/equalizing circuit 22 and that of the address temporarily storing register 23. Signal lines RAWL0 to RAWL3 of the address temporarily storing register 23 operate such that RWL0 to RWL3 correspond to the numbers. In other words, when the position of data of the cell is changed, the position of the address is also controlled to be changed.

Figure 26:
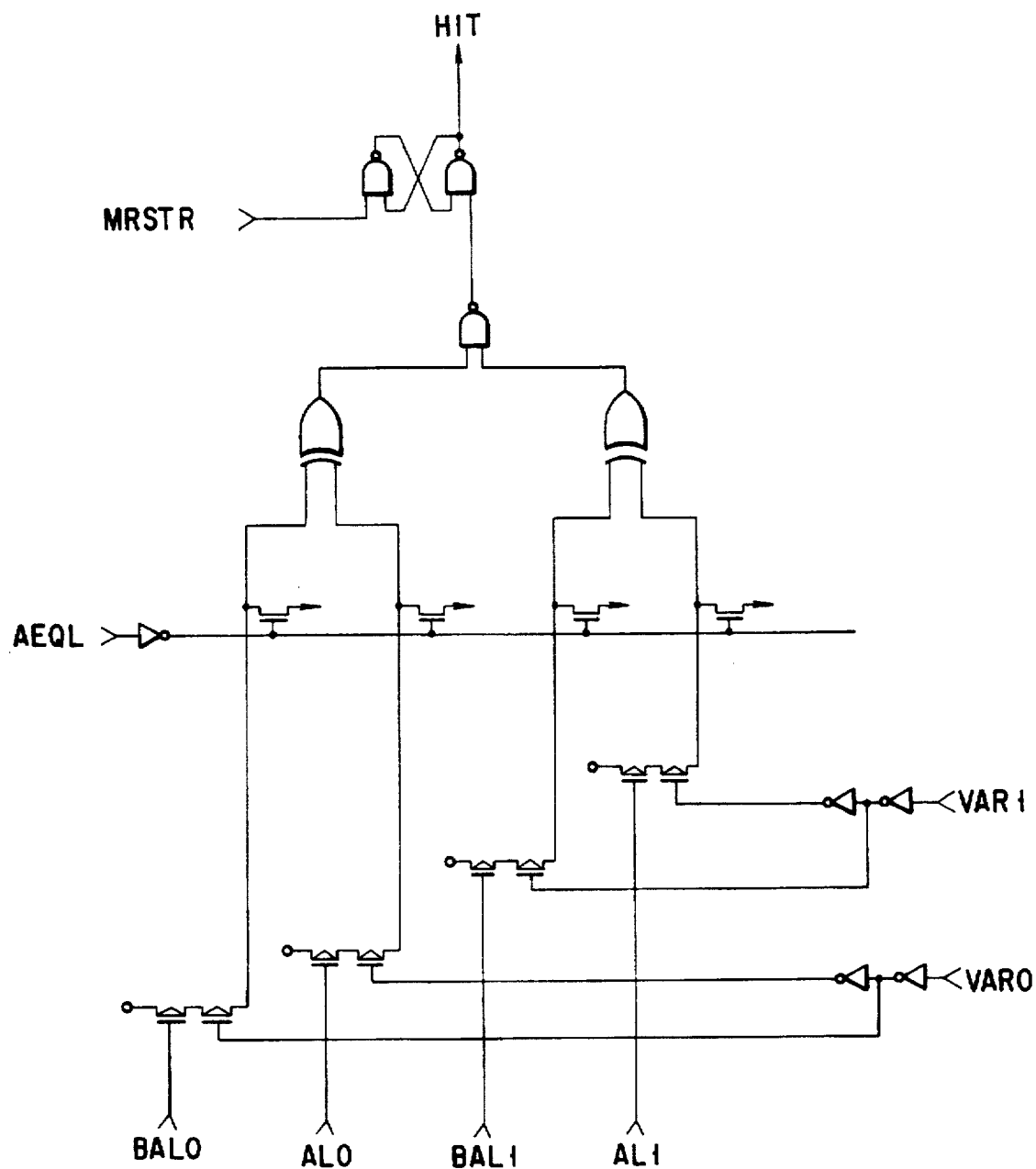
FIG. 26 is a view showing a specific structure of an address comparator used in the data changing control circuit.

FIG. 26 shows the specific structure of the address comparator 24. When the least significant two bits are inputted from the outer section, the address from the outer section is compared with the address stored in the address register 21 in order as synchronizing with the data reading. When the address from the outer section is conformed to the address stored in the address register 21, an HIT signal becomes "H", and it is informed to the CPU, the control pulse generating circuit 12 and the writing order changing circuit 25 that referred data is presently being read from the outer section to the sense amplifier. Whereby, CPU starts to read data. Moreover, the pulse controlling circuit 12 is set such that the writing operation is performed from the clock of the VBXFCK. The HIT signal continues to output "H" until the writing operation is ended.

Figure 27:
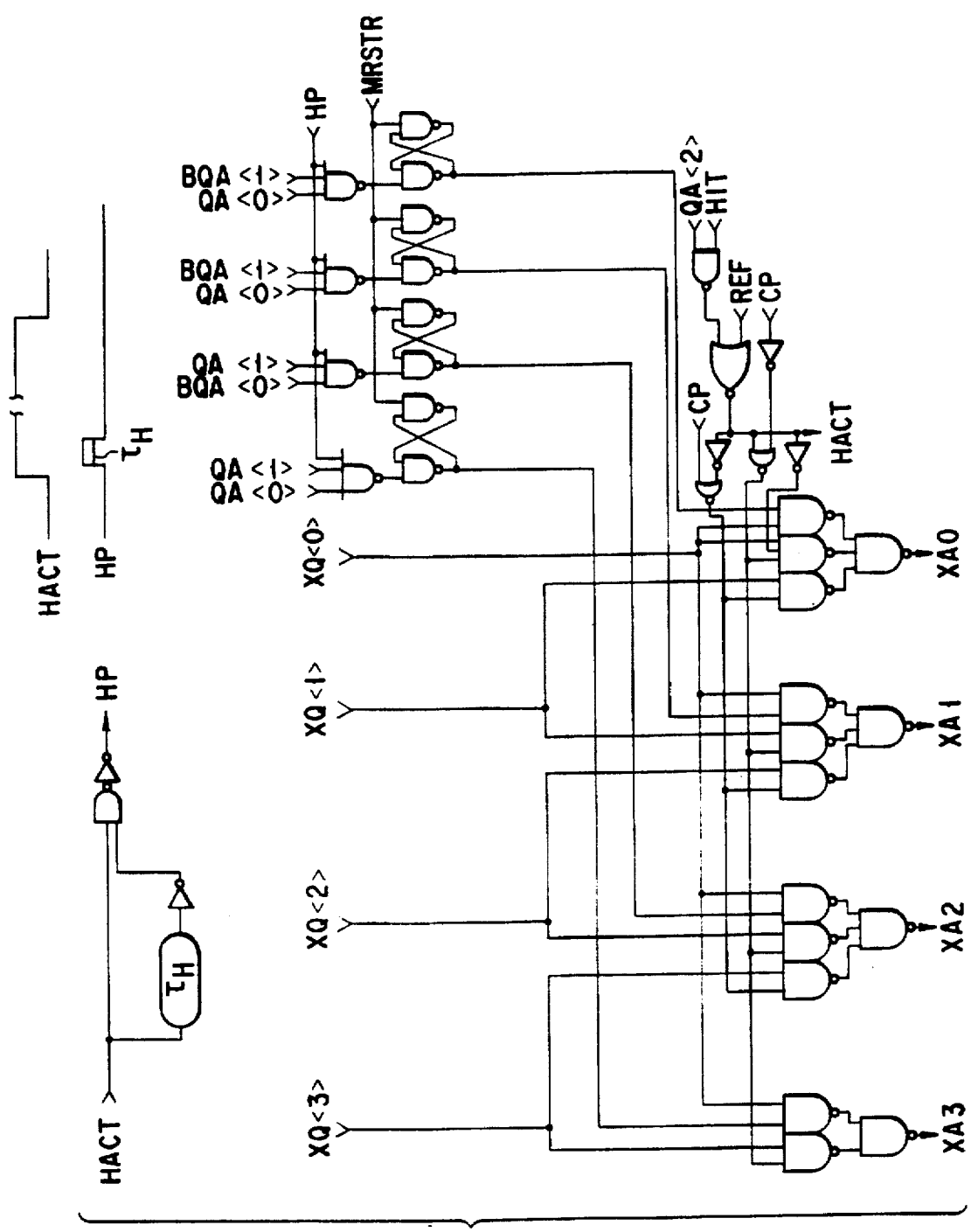
FIG. 27 is a view showing a specific structure of a writing order changing circuit used in the data changing control circuit.

FIG. 27 shows the specific structure of the writing order changing circuit 25, and FIG. 28 shows the specific structure of the copy/changing selection circuit 26. The writing order changing circuit 25 sets a REF signal to "H" when refresh is performed, and transmits each of signals XQ<0> to XQ<3> sent from the control pulse generating circuit 12 to each of XA0 to XA3. Also, the writing order changing circuit 25 set a CP signal to "H" when data is copied. Moreover, when data is changed in the unit, the writing order changing circuit 25 set the CP signal to "L."

The following will explain a case in which data is changed and a case in which data is copied when the third cell, which is counted from the bit line contact, is accessed from the outer section. First, the case in which data is changed will be explained. If XA2 is activated at the time of the normal access and the HIT signal becomes "H", XA2 is connected to XQ<0>, XA1 is connected to XQ2<2>, and XA0 is connected to XQ<1> at the clock of the next VBXFCK. The timing view is shown in FIGS. 29 and 30, and the state of data movement is shown in FIGS. 31A to 32C. By such connections, referred data which is written late from the outer section, and stored in the cell which is closest to the bit line contact of the memory cell unit. Moreover, regarding the order of data of the memory cell unit, by use of the above control, old referred data is sequentially inputted time-serially from the furthermost cell from the bit line contact, and newly referred data is sequentially inputted time-serially from the cell which is closest to the bit line contact.

Figures 31A, 31B, 31C:
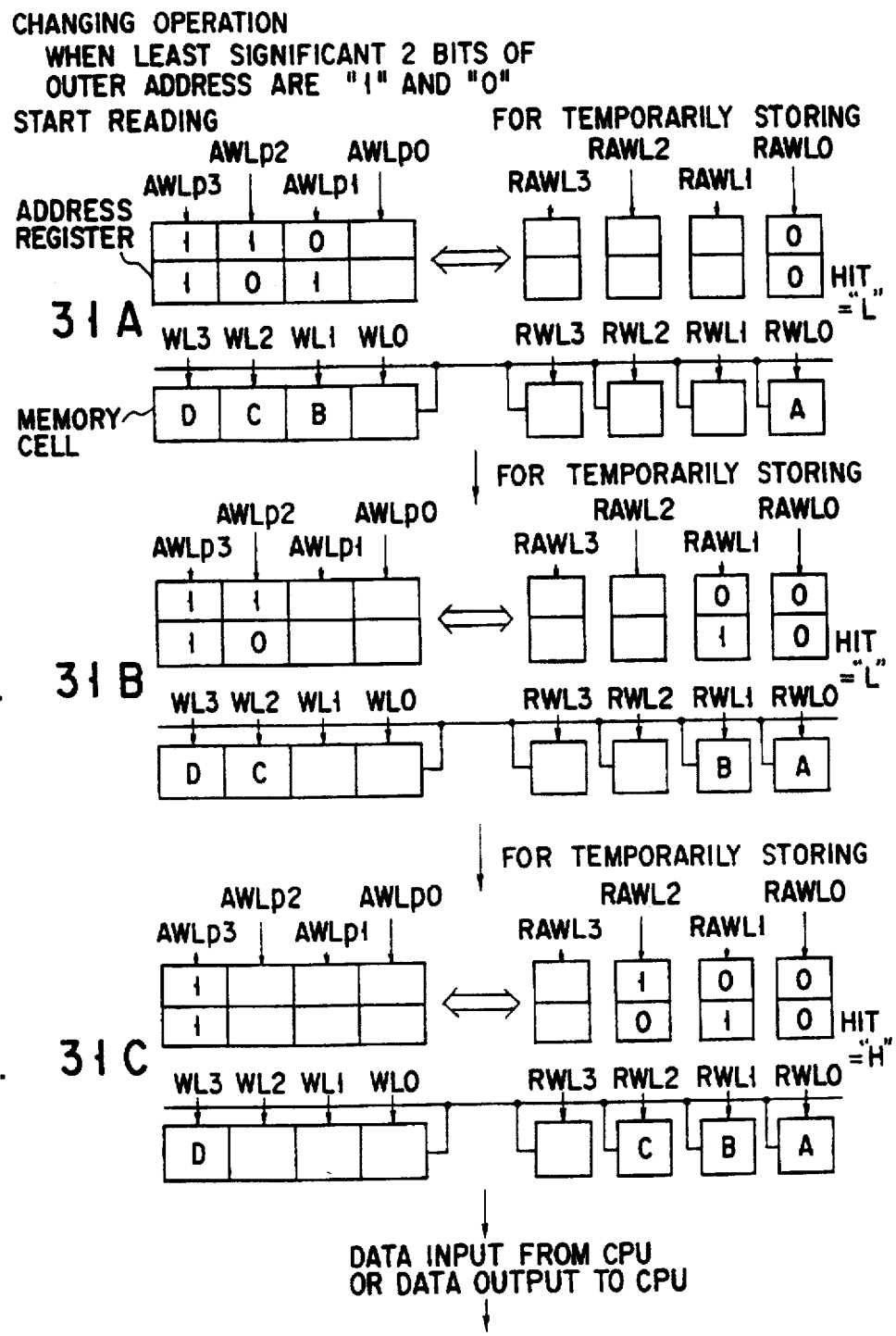
FIGS. 31A to 31C are views showing a state of data movement at a read-out time in a case where data is changed.

As one example, the following will explain the case in which the least significant bits of the outer address are "1, 0." As shown in FIG. 31A, as the first, data A of the memory cell, which is closest to the bit line contact, is read to the temporarily storing cell, and the address which corresponds to the memory cell, is read to the address temporarily storing register at the same time.

Next, as shown in FIG. 31B, as the second, data B of the memory cell, which is the second closest to the bit line contact, and the address are read. Moreover, as shown in FIG. 31C, as the third, data C of the memory cell, which is the third closest to the bit line contact, and the address are read. Then, data C of the memory cell, which is read late, is outputted to the outer section.

Next, data and the address which are temporarily stored, are rewritten to the memory cell and the address register. At this time, excepting data C (as the third) of the memory cell, which is read late, other data and the addresses are written in order.

Figure 32A:
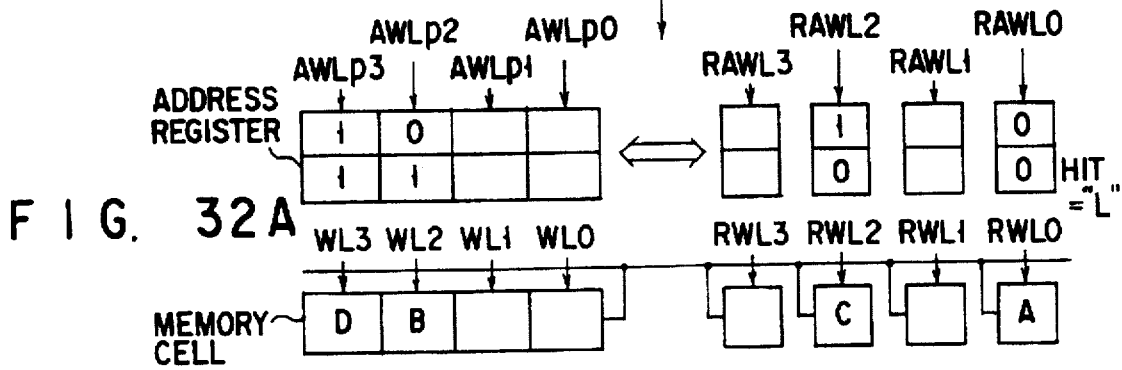
FIGS. 32A to 32C are views showing a state of data movement at a re-write time in a case where data is changed.
Figure 32B:
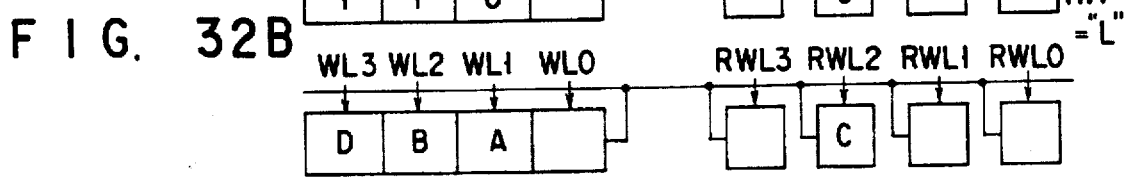

More specifically, as shown in FIG. 32A, data B of the memory cell, which is read second, and the address are rewritten to the memory cell which is read third, and the position of the address register. Sequentially, as shown in FIG. 32B, data A of the memory cell, which is read first, and the address are rewritten to the memory cell which is read second, and the position of the address register.

Figure 32C:
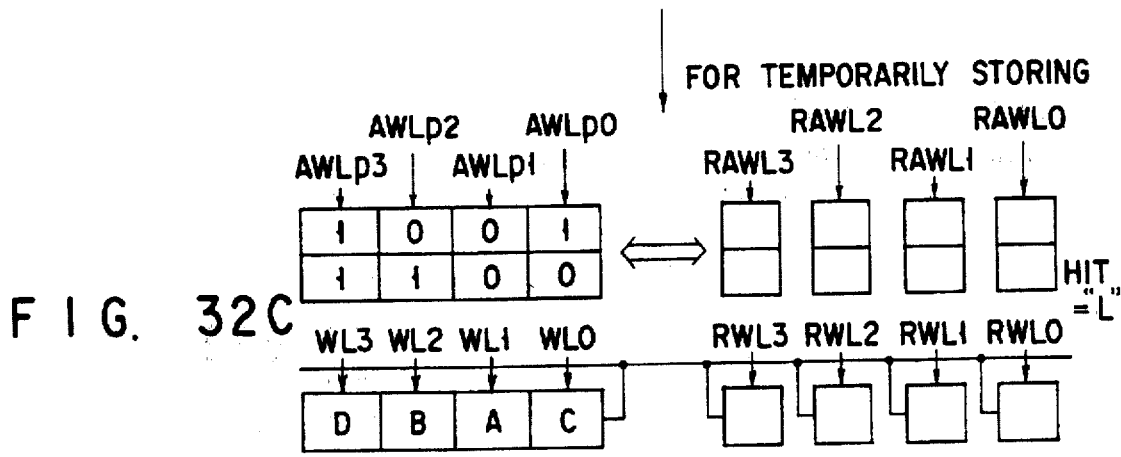

Then, as shown in FIG. 32C, data C of the memory cell, which is read late, and the address are rewritten to the memory cell which is read first, and the position of the address register. Whereby, the rewriting operation is ended. Under this state, data of the memory cell which is closest to the bit line contact, becomes C, that is, recently read data.

On the other hand, in the case where data is copied in the memory cell unit, a CP signal is set to "H." The timing view is shown in FIG. 33, and the state of data movement is shown in FIGS. 34A to 35C. If XA2 is activated at the time of the normal access and the HIT signal becomes "H", XA2 is connected to XQ<0> and XQ<2>, and XA1 is connected to XQ<1> at the next clock of the next VBXFCK. If the writing operation is started under this state, referred data is copied from the outer section to the memory cell which is closest to the bit line contact. At this time, since the copy/changing selection circuit 26 shown in FIG. 26 connects XQ<0> to XQ<3> to XB0, XB1, XB2, XB3, the contents of the address register are not changed.

Figure 34A:
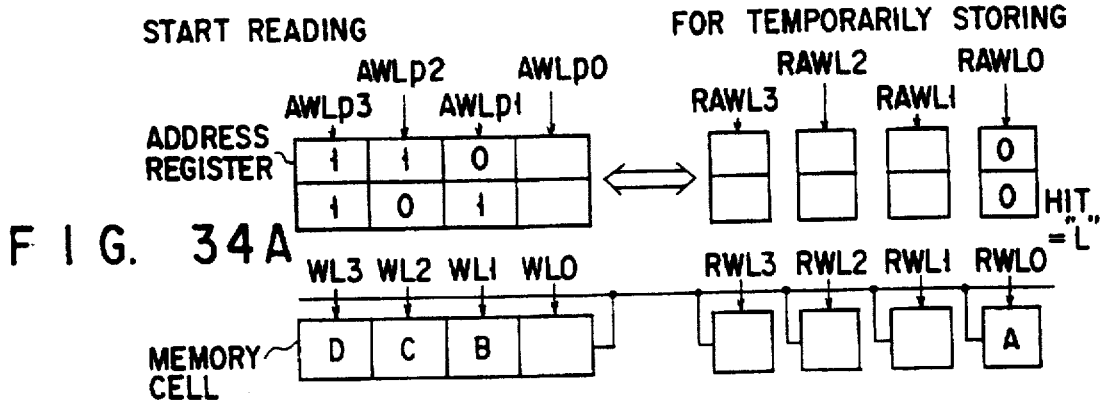
FIGS. 34A to 34C are views showing a state of data movement at a read-out time in a case where data is copied.

As one example, the following will explain the case in which the least significant bits of the outer address are "1, 0." As shown in FIG. 34A, as the first, data A of the memory cell which is closest to the bit line contact, is read to the temporarily storing cell, and the address which corresponds to the memory cell, is read to the address temporarily storing register at the same time.

Figure 34B:
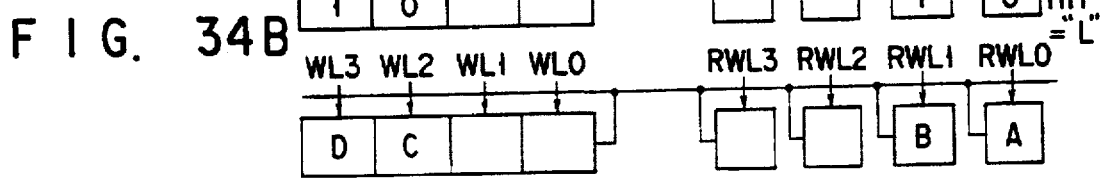
Figure 34C:
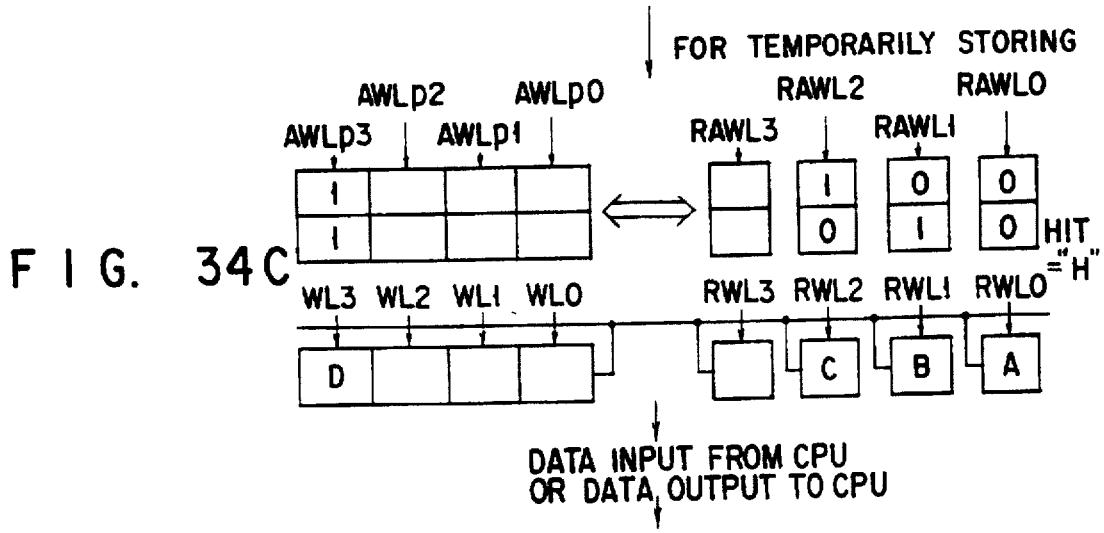

Next, as shown in FIG. 34B, as the second, data B of the memory cell, which is the second closest to the bit line contact, and the address are read. Moreover, as shown in FIG. 34C, as the third, data C of the memory cell which is the third closest to the bit line contact, and the address are read. Then, data C of the memory cell, which is read late, is outputted to the outer section. So far, the above case is the same as the case in which the data is changed.

Next, data and the address which are temporarily stored, are rewritten to the memory cell and the address register. At this time, data C of the memory cell, which is read late (third) is rewritten to the original position, and written to the memory cell which is closest to the bit line.

Figure 35A:
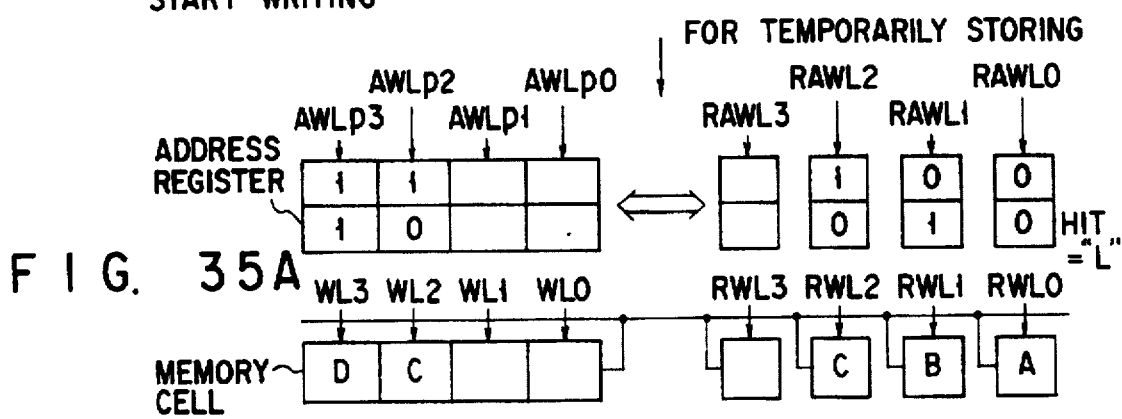
FIGS. 35A to 35C are views showing a state of data movement at a re-write time in a case where data is copied.
Figure 35B:
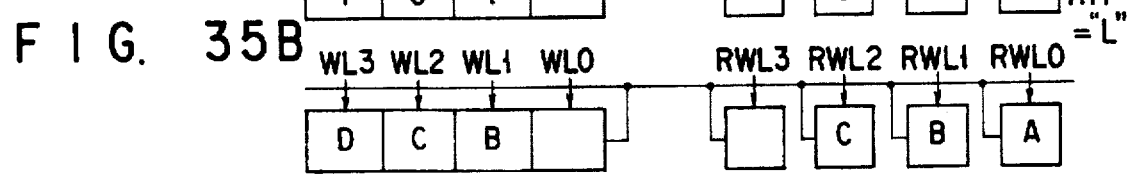

More specifically, as shown in FIG. 35A, data C of the memory cell, which is read late, and the address are rewritten to the memory cell which is read late, and the position of the address register. Sequentially, as shown in FIG. 35B, data B of the memory cell, which is read second, and the address are rewritten to the memory cell which is read second, and the position of the address register.

Figure 35C:
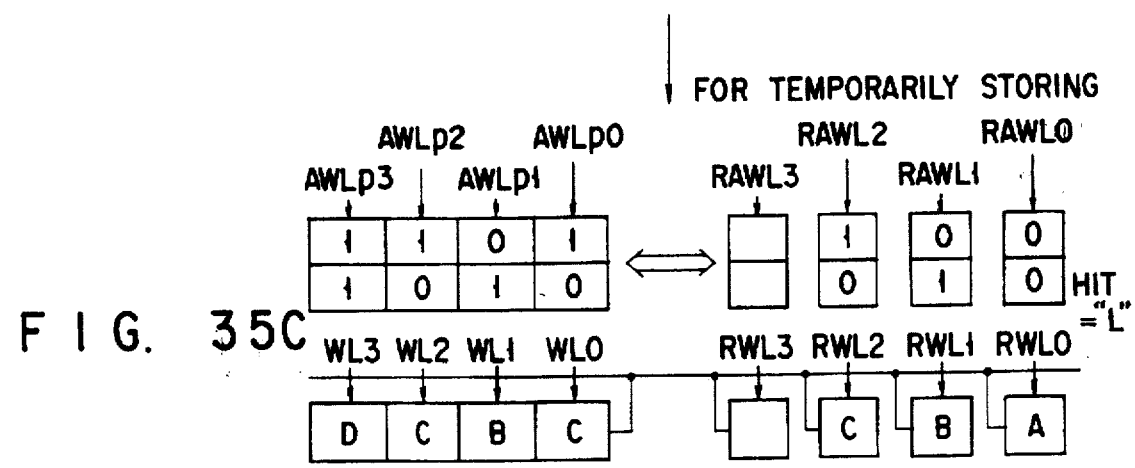
Figure 37A:
FIGS. 37A and 37B are views showing a specific structure of a decoder for address temporarily storing register and that of an address register core controlling circuit.
Figure 37B:
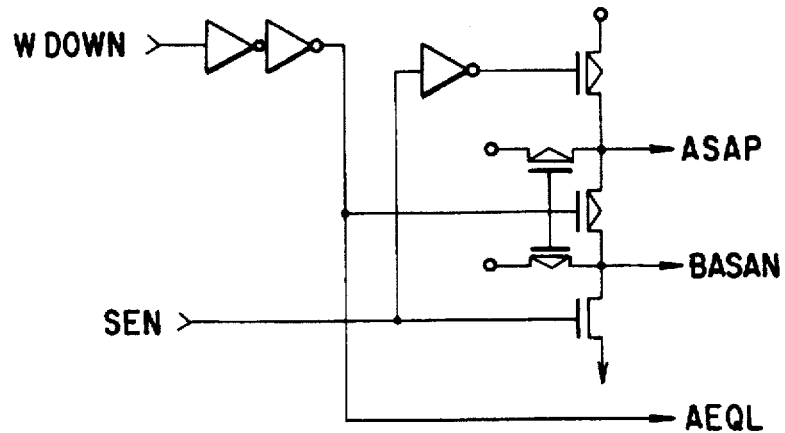
Figure 38A:
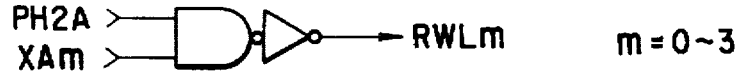
FIGS. 38A and 38B are views showing a specific structure of a register row decoder and that of a core controlling circuit.
Figure 38B:
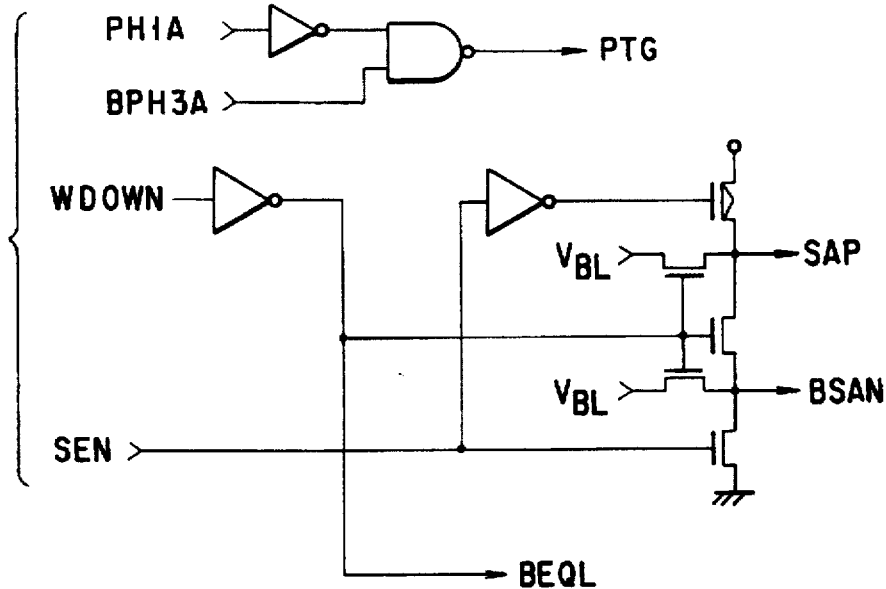

Then, as shown in FIG. 35C, not data A, which is read first, but data C of the memory cell, which is read late, and the address are rewritten to the memory cell which is read first, and the position of the address register. Whereby, the rewriting operation is ended. Under this state, data of the memory cell which is closest to the bit line contact, becomes C, that is, recently read data.

Figure 42:
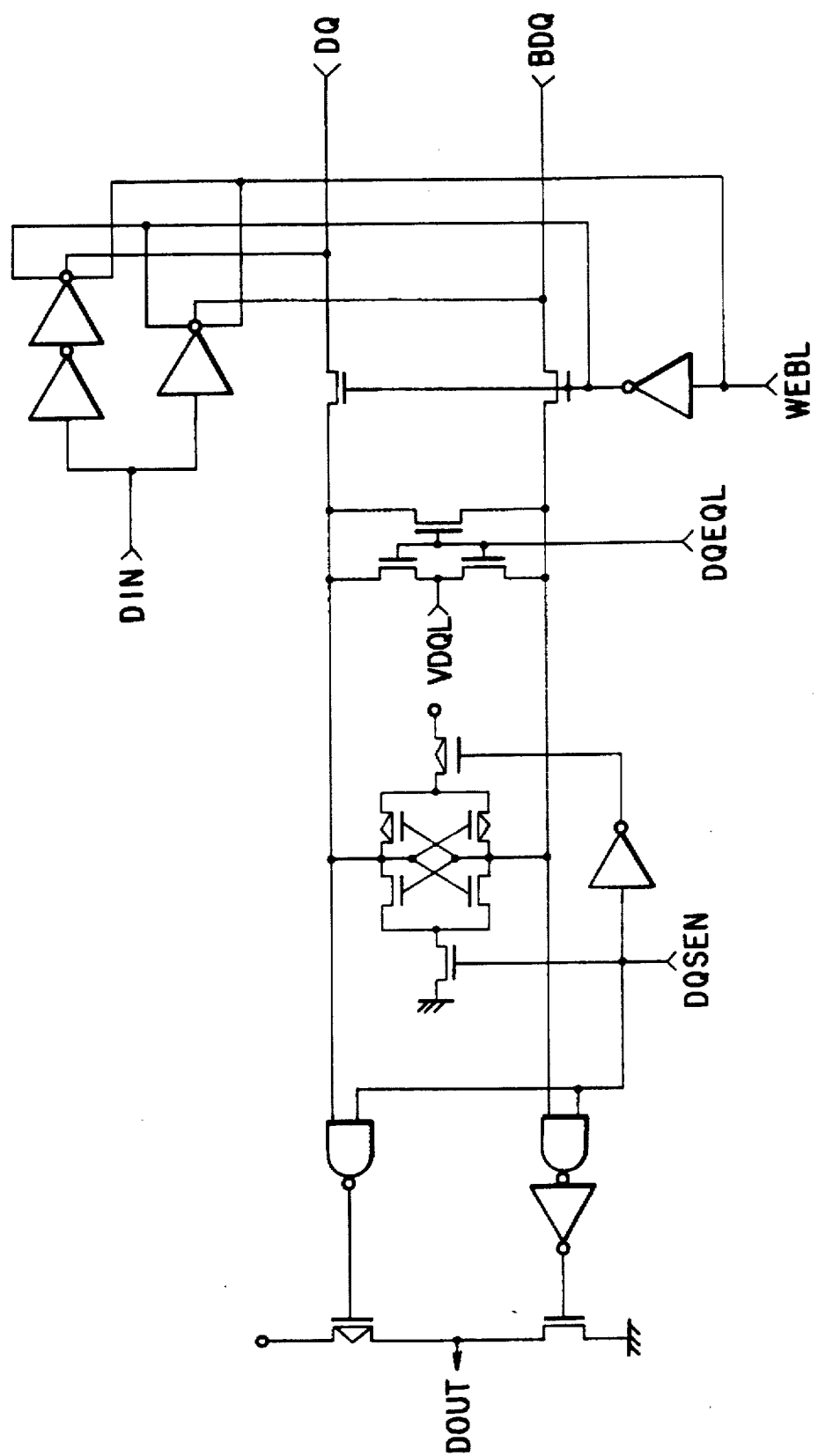
FIG. 42 is a view showing a specific structure of an I/O buffer.

For reference, the specific structure of each part is shown in FIGS. 36 to 42. FIG. 36 shows the row decoder of FIG. 23, FIG. 37A shows the decoder for address temporarily storing register, and FIG. 37B shows the specific structure of the address register core controlling circuit. FIG. 38A shows the core controlling circuit of FIG. 15, FIG. 38B shows the register row decoder, FIGS. 39A to 39C show the address buffer, FIGS. 40A and 40B show row and column decoders, FIGS. 41A and 41B show the I/O controlling circuit, and FIG. 42 shows the specific structure of the I/O buffer.

As mentioned above, according to the above embodiment, there is provided the data changing circuit controlling circuit 13 for changing or copying arbitrary data of the memory cell unit, and controlling the position such that data, which is expected to be accessed next, is stored in the memory cell which is closest to the bit line contact of the memory cell unit. Due to this, when data is accessed next, data can be read for the shortest time, and the average access time of the memory and the average cycle time can be reduced as compared with the conventional case.

(Seventh Embodiment)

In the above-mentioned embodiment, data receiving/transmitting from/to the outer section is performed when data is read to the register for temporarily storing from the memory cell unit. In place of this operation, data receiving/transmitting from/to the outer section may be performed when data is restored to the memory cell unit from the register. This embodiment is shown in FIGS. 43A to 47. The base circuit structure and the signal waveform of this embodiment is the same as the previous embodiments.

First, the case in which data is changed will be explained. If XA2 is activated at the time of the normal access and the HIT signal becomes "H", XA2 is connected to XQ<0>, XA1 is connected to XQ2<2>, and XA0 is connected to XQ<1> at the clock of the next VBXFCK. The timing view is shown in FIGS. 29 and 30, and the state of data movement is shown in FIGS. 43A to 44C. By such connections, referred data is written late from the outer section, and stored in the cell which is closest to the bit line contact of the memory cell unit. At this time, by a CPU access start signal generating circuit shown in FIG. 47, it is informed to the CPU that access can be started. Regarding the order of data of the memory cell unit, by use of the above control, old referred data is sequentially inputted time-serially from the furthermost cell from the bit line contact, and newly referred data is sequentially inputted time-serially from the cell which is closest to the bit line contact.

As one example, the following will explain the case in which the least significant bits of the outer address are "1, 0." As shown in FIG. 43A, as the first, data A of the memory cell, which is closest to the bit line contact, is read to the temporarily storing cell, and the address which corresponds to the memory cell, is read to the address temporarily storing register at the same time.

Next, as shown in FIG. 43B, as the second, data B of the memory cell, which is the second closest to the bit line contact, and the address are read. Moreover, as shown in FIG. 43C, as the third, data C of the memory cell, which is the third closest to the bit line contact, and the address are read.

Next, data and the address which are temporarily stored, are rewritten to the memory cell and the address register. At this time, excepting data C (as the third) of the memory cell, which is read late, other data and the addresses are written in order.

Figure 44A:
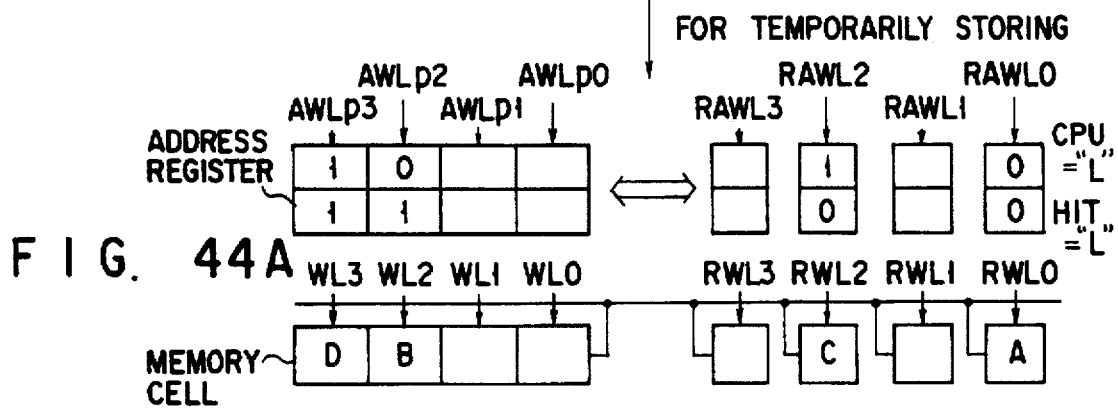
FIGS. 44A to 44C are views showing a state of data movement in a case where data is changed.
Figure 44B:
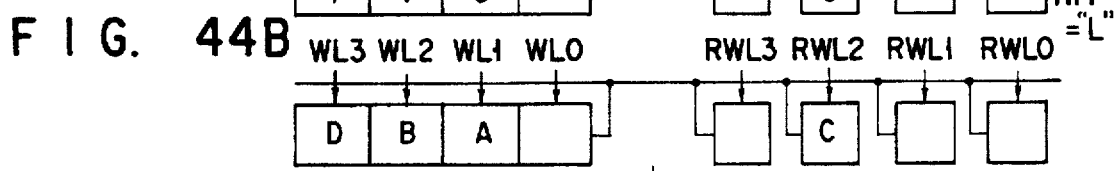

More specifically, as shown in FIG. 44A, data B of the memory cell which is read second, and the address are rewritten to the memory cell which is read third, and the position of the address register. Sequentially, as shown in FIG. 44B, data A of the memory cell, which is read first, and the address are rewritten to the memory cell which is read second, and the position of the address register.

Figure 44C:
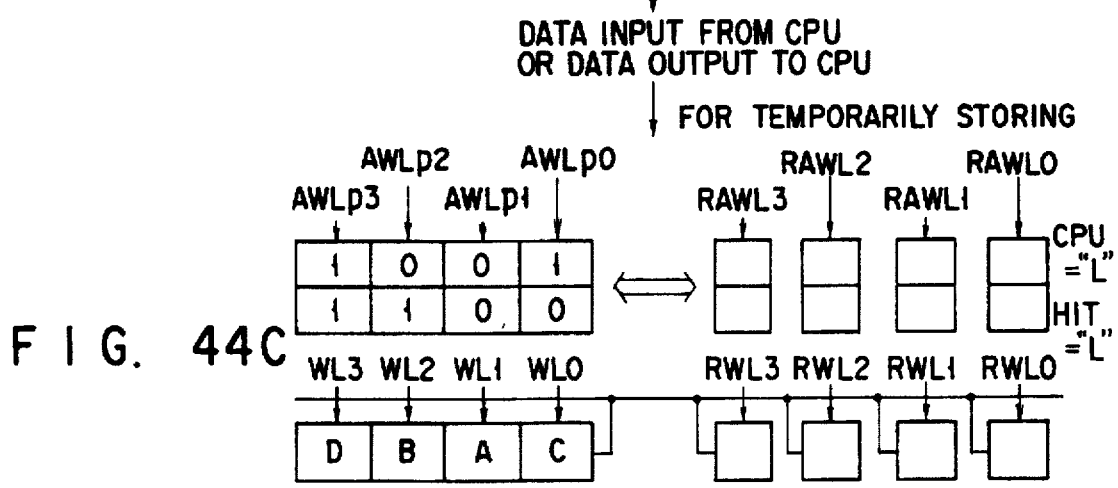

Then, as shown in FIG. 44C, data C of the memory cell, which is read late, and the address are rewritten to the memory cell which is read first, and the position of the address register. At this time, data C of the memory cell is outputted to the outer section. Whereby, the rewriting operation is ended. Under this state, data of the memory cell which is closest to the bit line contact, becomes C, that is, recently read data.

On the other hand, in the case where data is copied in the memory cell unit, the CP signal is set to "H." The timing view is shown in FIG. 33, and the state of data movement is shown in FIGS. 45A to 46C. If XA2 is activated at the time of the normal access and the HIT signal becomes "H", XA2 is connected to XQ<0>, XQ<2>, and XA1 is connected to XQ<1> at the next clock of the next VBXFCK. If the writing operation is started under this state, referred data is copied from the outer section to the memory cell which is closest to the bit line contact. At this time, since the copy/changing selection circuit 26 shown in FIG. 28 connects XQ<0> to XQ<3> to XB0, XB1, XB2, XB3, the contents of the address register are not changed.

Figure 45A:
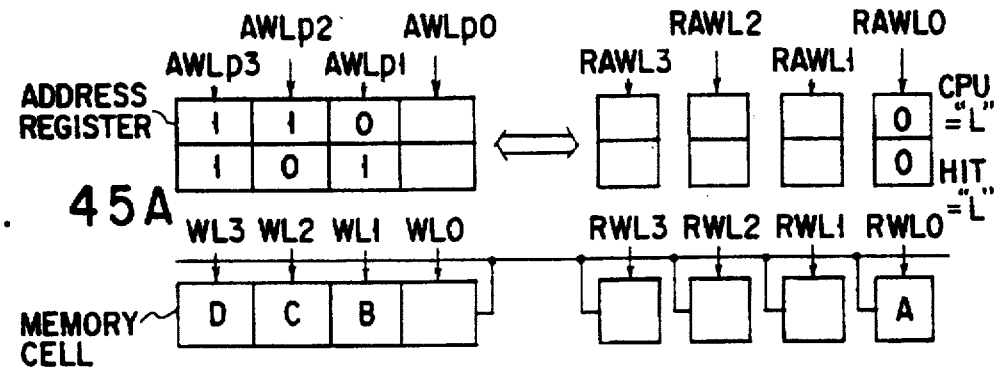
FIGS. 45A to 45C are views showing a state of data movement in a case where data is copied.

As one example, the following will explain the case in which the least significant bits of the outer address are "1, 0." As shown in FIG. 45A, as the first, data A of the memory cell, which is closest to the bit line contact, is read to the temporarily storing cell, and the address which corresponds to the memory cell, is read to the address temporarily storing register at the same time.

Figure 45B:
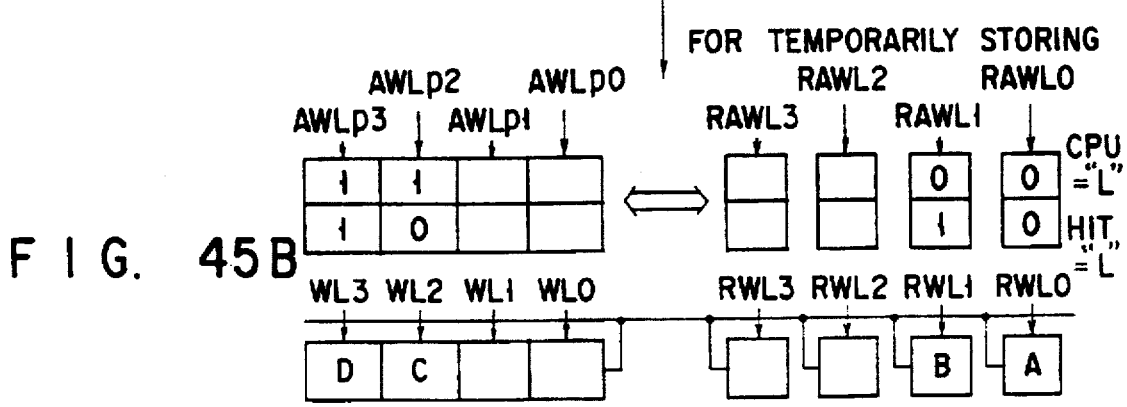
Figure 45C:
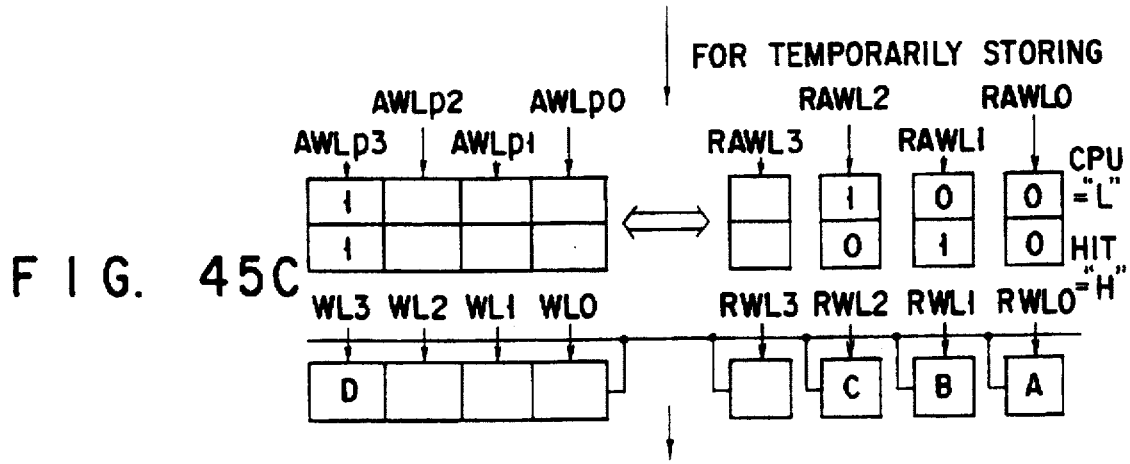

Next, as shown in FIG. 45B, as the second, data B of the memory cell, which is the second closest to the bit line contact, and the address are read. Moreover, as shown in FIG. 45C, as the third, data C of the memory cell, which is the third closest to the bit line contact, and the address are read. Then, data C of the memory cell, which is read late, is outputted to the outer section. So far, the above case is the same as the case in which the data is changed.

Next, data and the address, which are temporarily stored, are rewritten to the memory cell and the address register. At this time, data C of the memory cell, which is read late (third) is rewritten to the original position, and written to the memory cell which is closest to the bit line.

Figure 46A:
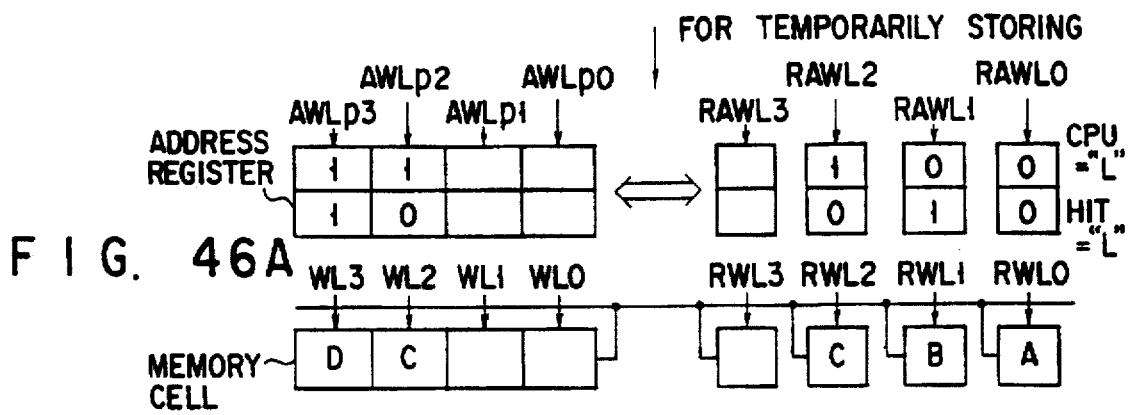
FIGS. 46A to 46C are views showing a state of data movement in a case where data is copied.
Figure 46B:
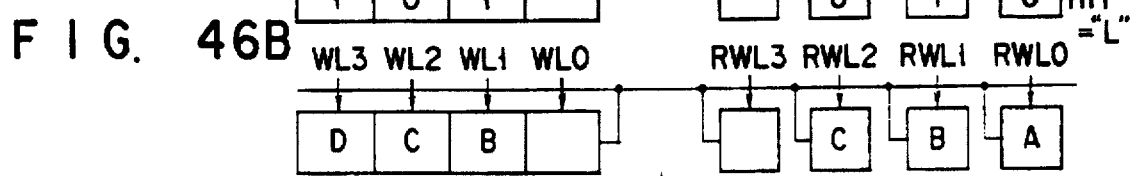

More specifically, as shown in FIG. 46A, data C of the memory cell, which is read late, and the address are rewritten to the memory cell which is read late, and the position of the address register. Sequentially, as shown in FIG. 46B, data B of the memory cell, which is read second, and the address are rewritten to the memory cell which is read second, and the position of the address register.

Figure 46C:
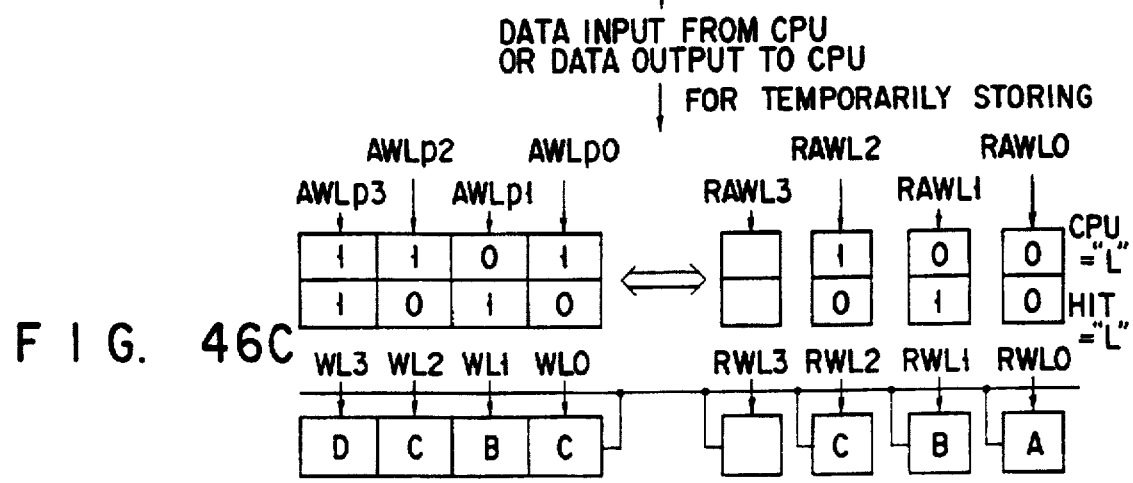
Figure 47:
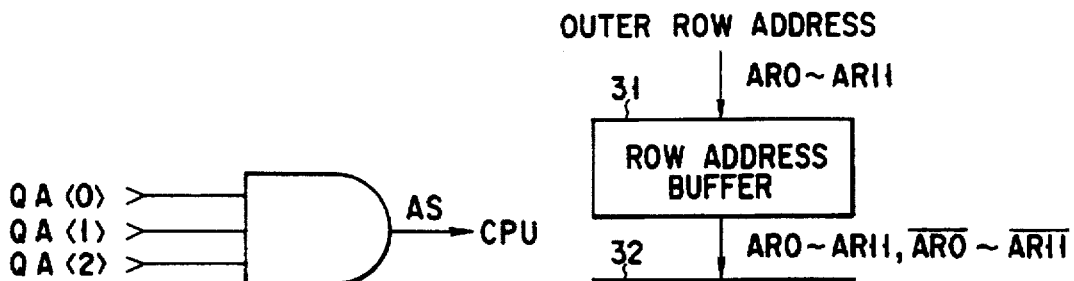
FIG. 47 is a view showing a specific structure of a CPU access start signal generating circuit.

Then, as shown in FIG. 46C, not data A, which is read first, but data C of the memory cell which is read late, and the address are rewritten to the memory cell which is read first, and the position of the address register. At this time, data C of the memory cell is outputted to the outer section. Whereby, the rewriting operation is ended. Under this state, data of the memory cell which is closest to the bit line contact, becomes C, that is, recently read data.

It is of course that this embodiment can obtain the same advantage as the previous embodiments. In this embodiment, the first data access is late as compared with the previous embodiments. However, in this embodiment, there is merit in that a next data access is fast.

The above sixth and seventh embodiments are not limited to each of the above-explained embodiments. The above embodiments explained that the data changing controlling circuit was provided on the substrate which is the same as the memory chip. However, the data changing controlling circuit may be provided on a different substrate. In a case where the data changing controlling circuit is used in the plurality of memory chips in common, the necessary area may be small if the different substrate is used. Moreover, the above embodiments explained that data was copied or changed to the position which is closest to the bit line contact of the unit. However, the position is not limited in particularly. Other circuit structures can be designed so as to data can be moved to the other position of the same unit.

Furthermore, the above embodiments explained that the dynamic type memory cell was used. However, a nonvolatile memory cell such as an EEPROM can be used. In addition, various modifications can be worked in the scope without deviating from the gist of the present invention.

As mentioned above, according to the sixth and seventh embodiments, by controlling the position such that data which is expected to be accessed next, is stored in the memory cell which is closest to the bit line contact of the memory cell unit, data can be read for the shortest time when data is accessed next. Therefore, the average access time of the memory and the average cycle time can be reduced as compared with the conventional case.

(Eighth Embodiment)

Figure 48:
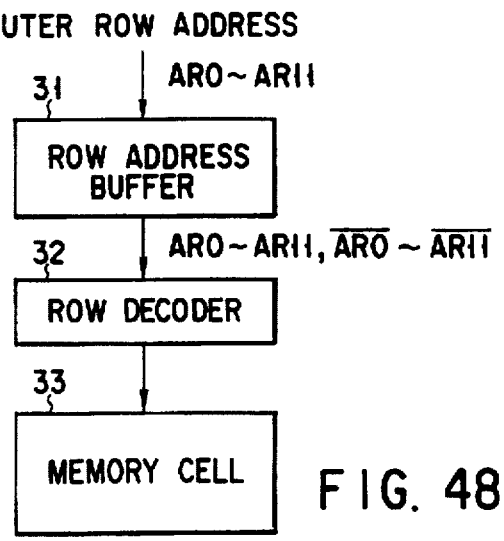
FIG. 48 is a block diagram showing a schematic structure of a semiconductor memory device of an eighth embodiment of the present invention.
Figure 49:
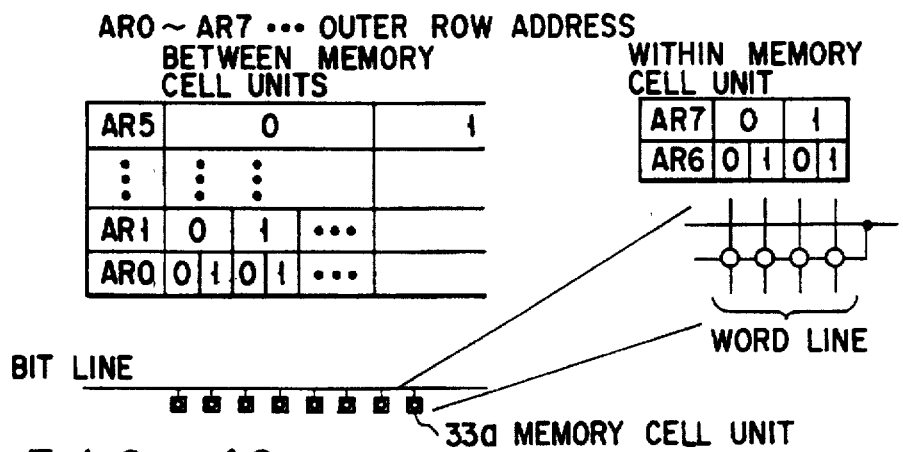
FIG. 49 is a view showing a memory map of the eighth embodiment of the present invention.

FIG. 48 is a block diagram showing the schematic structure of the semiconductor memory device of an eighth embodiment of the present invention, and FIG. 49 is a view showing a memory map of the same embodiment. Addresses (AR0 to AR11) inputted from the outer section are stored in a row address buffer 31. The row address buffer 31 transmits decoder signals (AR0 to AR11, /AR0 to /AR11) to a row decoder 32. The row decoder 32 activates the word line of a memory cell 33 based on the decoder signals (AR0 to AR11, /AR0 to /AR11).

It is assumed that the memory structure of this embodiment is the memory cell array, which is formed by connecting a plurality of memory cell units 33a each having a plurality of memory cells connected in series to the bit line. At this time, outer addresses (AR6, AR7) corresponding to the inside of the memory cell units is provided at the upper address than the parts (AR0 to AR5) of the outer addresses corresponding to the portion between the memory cell units. In this example, the memory cell unit comprising four memory cells is assumed. However, if the plurality of the memory cells are used, any number of the memory cells may be used, and there is no fundamental difference in the number of the memory cells.

In FIG. 49, the left side shows the selection of each memory cell unit, and the right side shows the selection of a memory cell within the memory cell unit. Also, addresses AR8 to AR11 (not shown) are used to select a block comprising a plurality of units.

In the access of the program of the computer, there is a property of a spatial locality of data. In other words, when data having a certain address is accessed, there is high possibility that data having an address close to the above certain address will be accessed. The addresses are made to correspond to each other as mentioned above, thereby making it possible to decrease the possibility that a next data is accessed to adjacent data of the same memory cell unit. Moreover, by combining with the system of storing data which stores a recently accessed data to the memory cell closest to the bit line of the memory cell unit, the average access time can be largely reduced.

Figure 50:
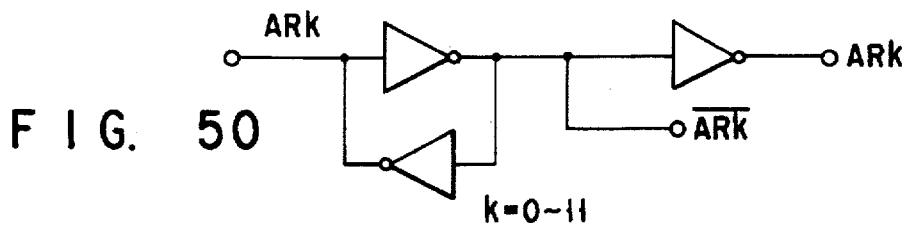
FIG. 50 is a circuit structural view showing a row address buffer used in the eighth embodiment of the present invention.
Figure 51:
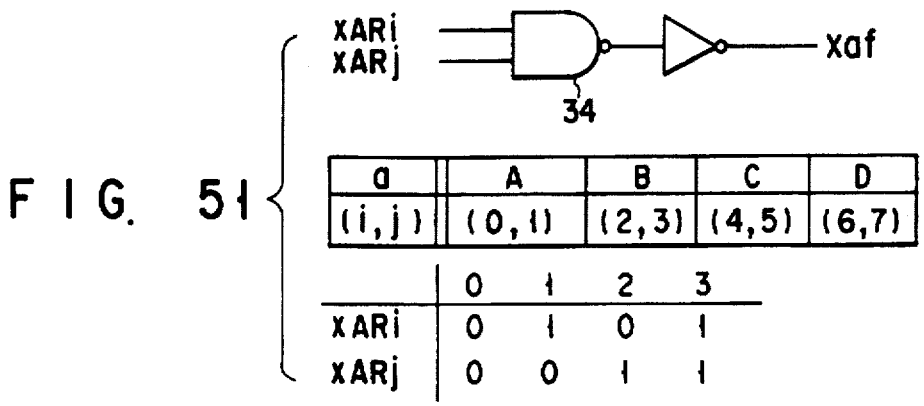
FIG. 51 is a view showing a circuit structure showing a pre-decode signal generating circuit used in the eighth embodiment of the present invention, and a view showing a relationship between I/O signals.

FIG. 50 shows a circuit structural view of the row address buffer 31. FIG. 51 shows the relationship between the circuit structure of a pre-decode signal generating circuit 34, which is provided between the row address buffer 31 and the row decoder 32, and the input/output. In the table shown in the lower portion of FIG. 51, "x" of signals xARi and xARj shows presence of "/" (bar), "0" denotes that a bar is present, and "1" denotes that no bar is present. In this example, a decoding system using a pre-code signal as shown in FIG. 51 can be considered. However, there is no fundamental difference even if there is used a system in which the decode signal is directly used from the row address buffer 31.

FIG. 52 is a circuit structural view of a WDRV driver 35 for generating a signal to correspond to an address for selecting the memory cell unit. In this example, the address signals for selecting the memory cell of the memory cell unit are D0 to D3 decoded from AR6 and AR7, which are upper addresses than the parts (AR0 to AR5) of the addresses for selecting each memory cell unit. FIG. 53 is a circuit structural view of a row decoder, which is operated by receiving the pre-decode signal of the pre-decode signal generating circuit 34 and that of the WDRV driver 35.

According to this embodiment, the outer addresses (AR6, AR7) corresponding to the inside of the memory cell units is made to correspond to the upper address than the parts (AR0 to AR5) of the outer address corresponding to the portion between the memory cell units. Whereby, it is possible to decrease the possibility that data of the memory cell unit will be accessed next. Moreover, by combining with the system of storing data which stores a recently accessed data to the memory cell closest to the bit line of the memory cell unit, the average access time can be largely reduced.

(Ninth Embodiment)

FIGS. 54A and 54B are block diagrams showing the schematic structure of a semiconductor memory device of a ninth embodiment of the present invention. Addresses (A0 to A11) inputted from the outer section are stored in the address buffer 31. The address buffer 31 transmits address decoder signals (A0 to A11, /A0 to /A11) to the address decoder 32. The address decoder 32 determines the cell which activates the word line of the memory cell 33, based on the decoder signals (AR0 to AR11, /AR0 to /AR11).

At this time, an address changing circuit 36 is provided in front of the address buffer 31 as shown in FIG. 54A. Or, as shown in FIG. 54B, the address changing circuit 36 is provided between the address buffer 31 and the address decoder 32. The address changing circuit 36 is a circuit, which selects the corresponding relationship between the outer address and the inner address from the plurality of the corresponding relationships by a signal from the outer section or a signal from the internal circuit.

FIG. 55 shows the specific structure of the address changing circuit 36. This example shows the case in which the address changing circuit 36 is provided as shown in FIG. 54A. Q04 to Q07 and Q14 to 17 are n channel MOS transistors. Ak (k=4 to 7) is an address inputted from the outer section. A'k (k=4 to 7) is an address of the inside of the memory. A signal ADC sent from the outer section is connected to the gate of Q14 to Q17, and connected to the gate of Q04 to Q07 through the inverter 11.

When ADC is set to "L", Q04 to Q07 are activated, and Q14 to Q17 are non-activated. Then, Ak (k=4 to 7) is connected to A'k (k=4 to 7). When ADC is set to "H", Q04 to Q07 are non-activated, and Q14 to Q17 are activated. At this time, the outer addresses A4 and A5 are connected to the inner addresses A'6 and A'7, and the outer addresses A6 and A7 are connected to the inner addresses A'4 and A'5.

As mentioned above, the address changing circuit 36 can change the corresponding relationship between the outer address and the inner address based on the signal ADC sent from the outer section. In this example, one of two corresponding relationships between the outer address and the inner address is selected based on the signal ADC sent from the outer section. However, one corresponding relationship between the outer address and the inner address can be selected from two or more corresponding relationships. Also, in the case where the address changing circuit 36 is provided as shown in FIG. 54B, the decoder signal and the addresses A4 to A7, and /A4 to /A7 are structured in the same manner as the case in which the address changing circuit 36 is provided as shown in FIG. 54A.

The above eighth and ninth embodiments are not limited to each of the above-explained embodiments. The above embodiments explained that the dynamic type memory cell was used. However, a nonvolatile memory cell such as an EEPROM can be used. Moreover, the number of the memory cells, which forms the NAND cell, is not limited to four, and the number of the memory cells can be suitably changed in accordance with the specification. Moreover, the structure for controlling the position of data is not limited to FIGS. 15 to 55, and the structure can be suitably changed in accordance with the specification. In addition, various modifications can be worked in the scope without deviating from the gist of the present invention.

As mentioned above, according to the eighth and ninth embodiments of the present invention, among the row addresses inputted from the outer section, the row address which selects the memory within the memory cell unit, is made to correspond to the upper address than another section of the row addresses which select the memory cell units. Whereby, the possibility that data of the same memory cell unit will be accessed next is decreased as compared with the conventional case, and the average access time can be largely reduced. Moreover, there is provided the circuit which can select the corresponding relationship between the outer address and the inner address from the plurality of the corresponding relationships therebetween. Whereby, the corresponding relationship between the outer and inner addresses can be selected by the outer signal for shorter average access time.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:

a memory cell array having a plurality of memory cell units wherein each of said memory cell units is formed of a plurality of memory cells to which consecutive row addresses are assigned;

a plurality of register cells for temporarily storing data read from each memory cell of the memory cell unit, and for temporarily storing data to be written to each memory cell of the memory cell unit, a number of said plurality of register cells being same as a number of said plurality of memory cells in each memory cell unit;

discriminating means for comparing a previous row address designating said memory cell unit with a present row address to discriminate whether or not these row addresses designate the same memory cell unit, said discriminating means include address latch circuits latching a previously input address, a number of said address latch circuits being same as a number of address bits needed for selecting the memory cell unit from whole row address bits; and reading means for directly reading data of the register cell during a reading operation when it is discriminated that the previous row address designates the same memory cell unit as the present row address by said discriminating means.

2. The semiconductor memory device according to claim 1, further comprising:

writing means for writing data into the register cells and restore the data to the memory cell, at the time of a writing operation when it is discriminated that the previous row address designates the same memory cell unit as the present row address by said discriminating means.

3. The semiconductor memory device according to claim 2, further comprising:

a register cell for refresh to be selected at the time of a refresh operation.

4. A semiconductor memory device comprising:

a memory cell array having a plurality of memory cell units wherein said memory cell array is formed of a plurality of memory cell units formed by connecting a plurality of memory cells in series, memory cells to which consecutive row addresses are assigned;

a plurality of register cells for temporarily storing data read from each memory cell of the memory cell unit, and for temporarily storing data to be written to each memory cell of the memory cell unit, a number of said plurality of register cells being same as a number of said plurality of memory cells in each memory cell unit;

discriminating means for comparing a previous row address designating said memory cell unit with a present row address to discriminate whether or not these row addresses designate the same memory cell unit, said discriminating means include address latch circuits latching a previously input address, a number of said address latch circuits being same as a number of address bits needed for selecting the memory cell unit from whole row address bits; and writing means for writing data to the register cell and restoring the data to the memory cell, without once reading data of the memory cell to the register cell during a writing operation when it is discriminated that the previous row address designates the same memory cell unit as the present row address by said discriminating means.

5. A semiconductor memory device according to claim 4, further comprising:

a register cell for refresh to be selected at the time of a refresh operation.

* * * * *